(12) United States Patent
Mullins

(10) Patent No.: US 6,298,107 B1
(45) Date of Patent: *Oct. 2, 2001

(54) NARROWBAND DIGITAL CORDLESS TELEPHONE WITH A LOGIC HIGH WEAK DRIVER AND A LOGIC LOW STRONG DRIVER FOR KEYPAD INTERFACE

(75) Inventor: Jacqueline Mullins, Austin, TX (US)

(73) Assignee: Legerity, Inc., Austin, TX (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/581,266

(22) Filed: Dec. 29, 1995

(51) Int. Cl.[7] .................................................. H03K 17/94
(52) U.S. Cl. ............................ 375/377; 345/168; 341/24; 341/26; 379/368; 84/655
(58) Field of Search ............................... 379/88, 211, 361, 379/387, 377, 385, 373, 368, 442, 82, 106.03, 203, 267, 269, 106.04, 106.06, 106.07; 345/168, 169, 174; 341/22, 24, 32, 34, 26; 455/76, 77, 557; 84/655

(56) References Cited

U.S. PATENT DOCUMENTS 5,717,343 * 2/1998 Kwong .................................. 326/27
6,125,139 * 9/2000 Hendrickson et al. ............. 375/220

* cited by examiner

Primary Examiner—Young T. Tse

(57) ABSTRACT

A digital cordless telecommunications unit that serves for communications when paired with a similar unit and connected with a network is disclosed. The unit receives and transmits analog voice signals and also transmits digital baseband signals and receives digital formatted baseband signals. The unit includes a baseband chip, as well as an audio functions block and a system control functions block. The audio functions block comprises an audio front end for receiving and transmitting the analog voice signals and an adaptive differential pulse code modulator codec, connected to the audio front end. The codec converts the analog voice signals to the digital baseband signals and converts the digital formatted baseband signals to the analog voice signals for transmission. The system control functions block comprises a microcontroller connected to the codec for controlling the baseband chip, a memory accessible by the microcontroller for storing control instructions, an interrupt controller connected to the microcontroller, a parallel port connected to the interrupt controller, a wake-up timer connected to the interrupt controller, a clock generator connected to the microcontroller, and a synchronous serial port connected to the interrupt controller.

5 Claims, 20 Drawing Sheets

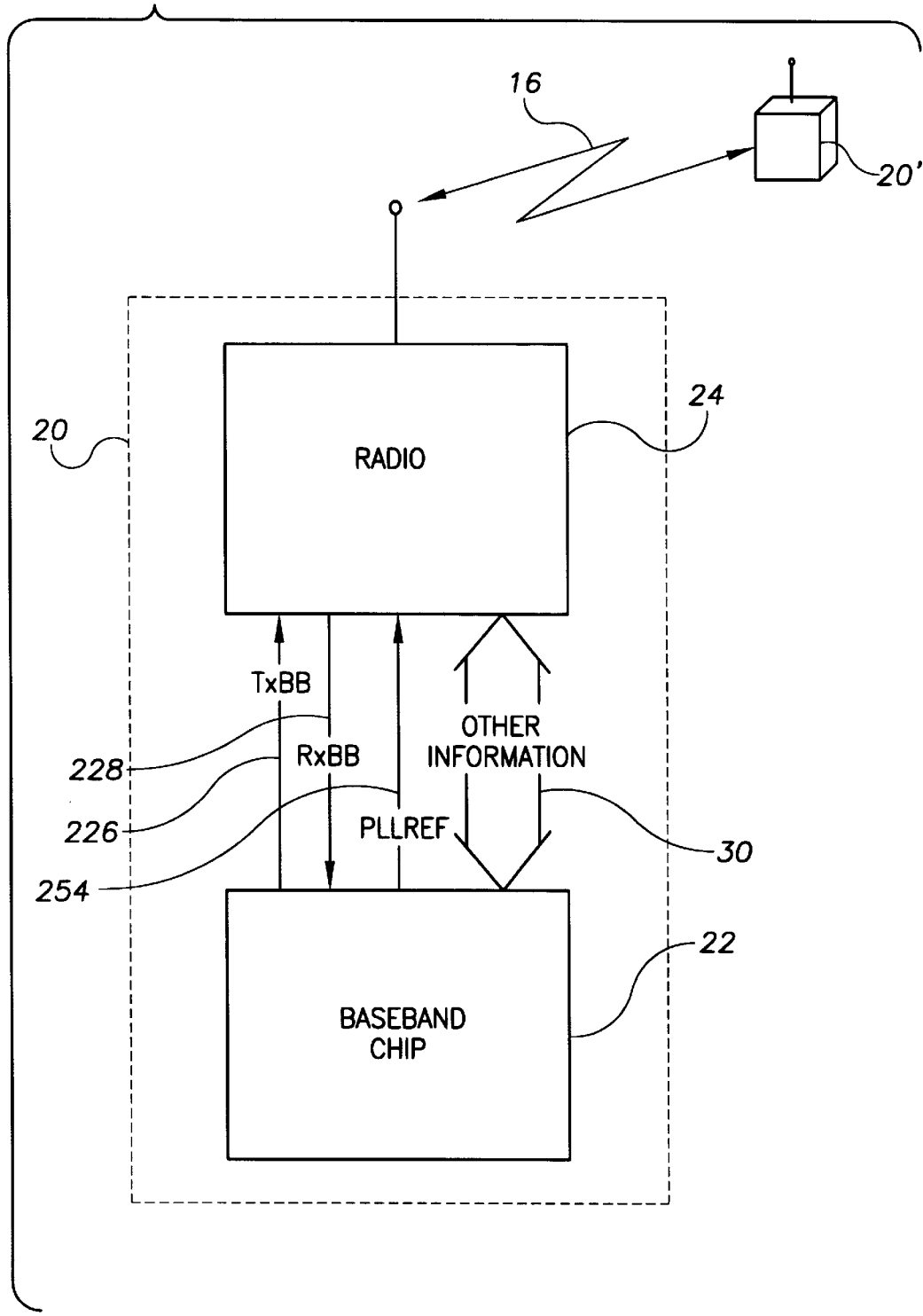

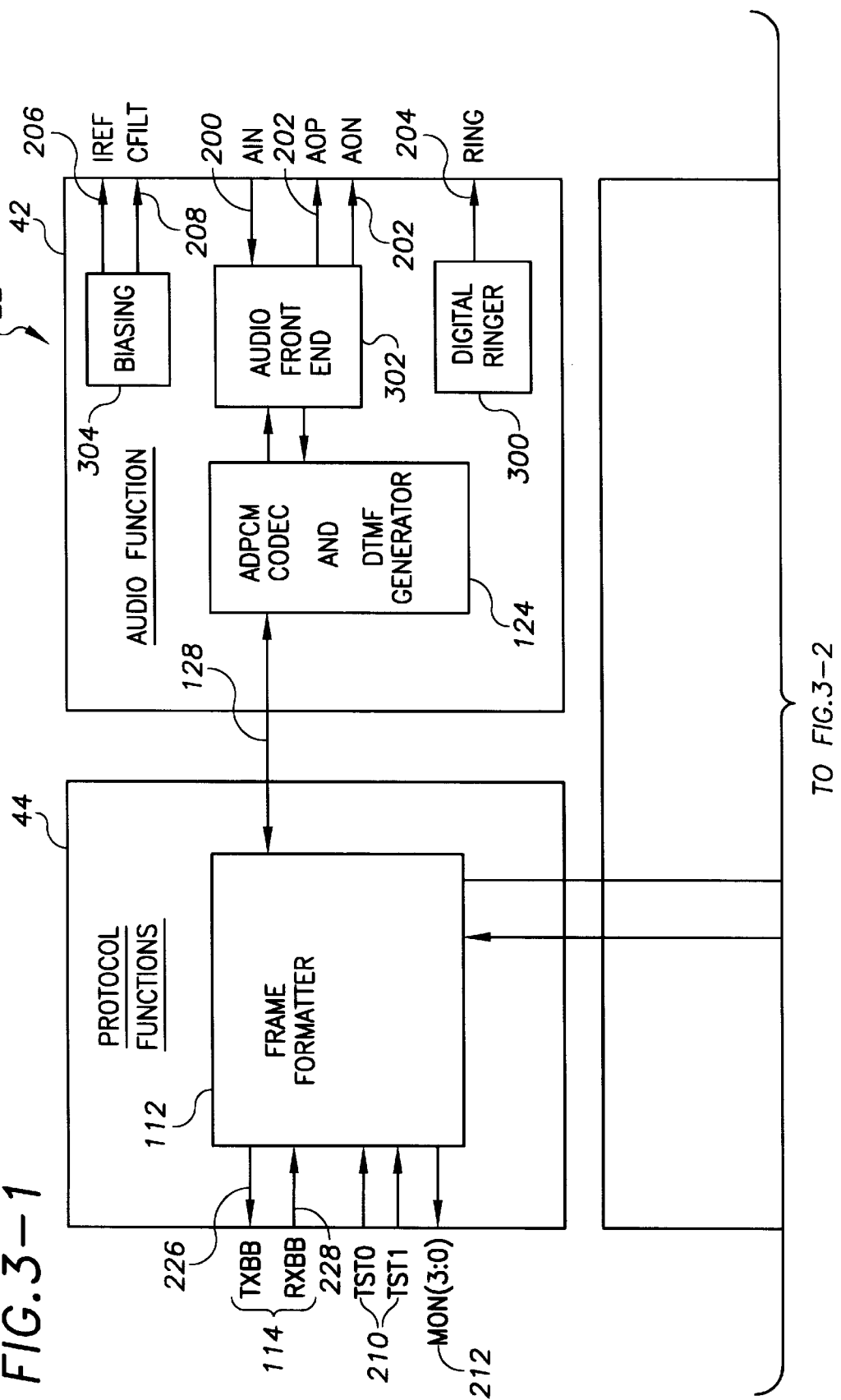

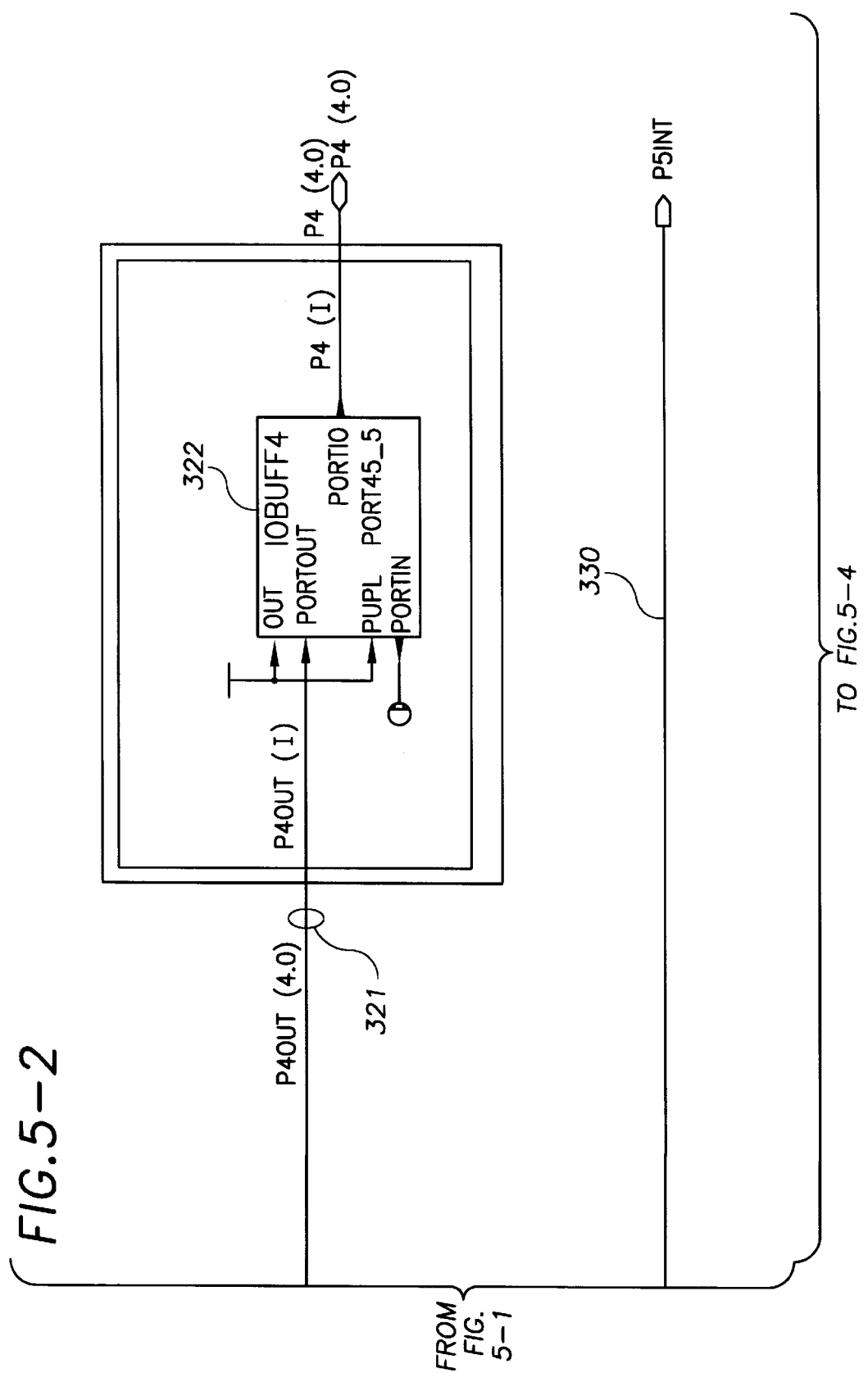

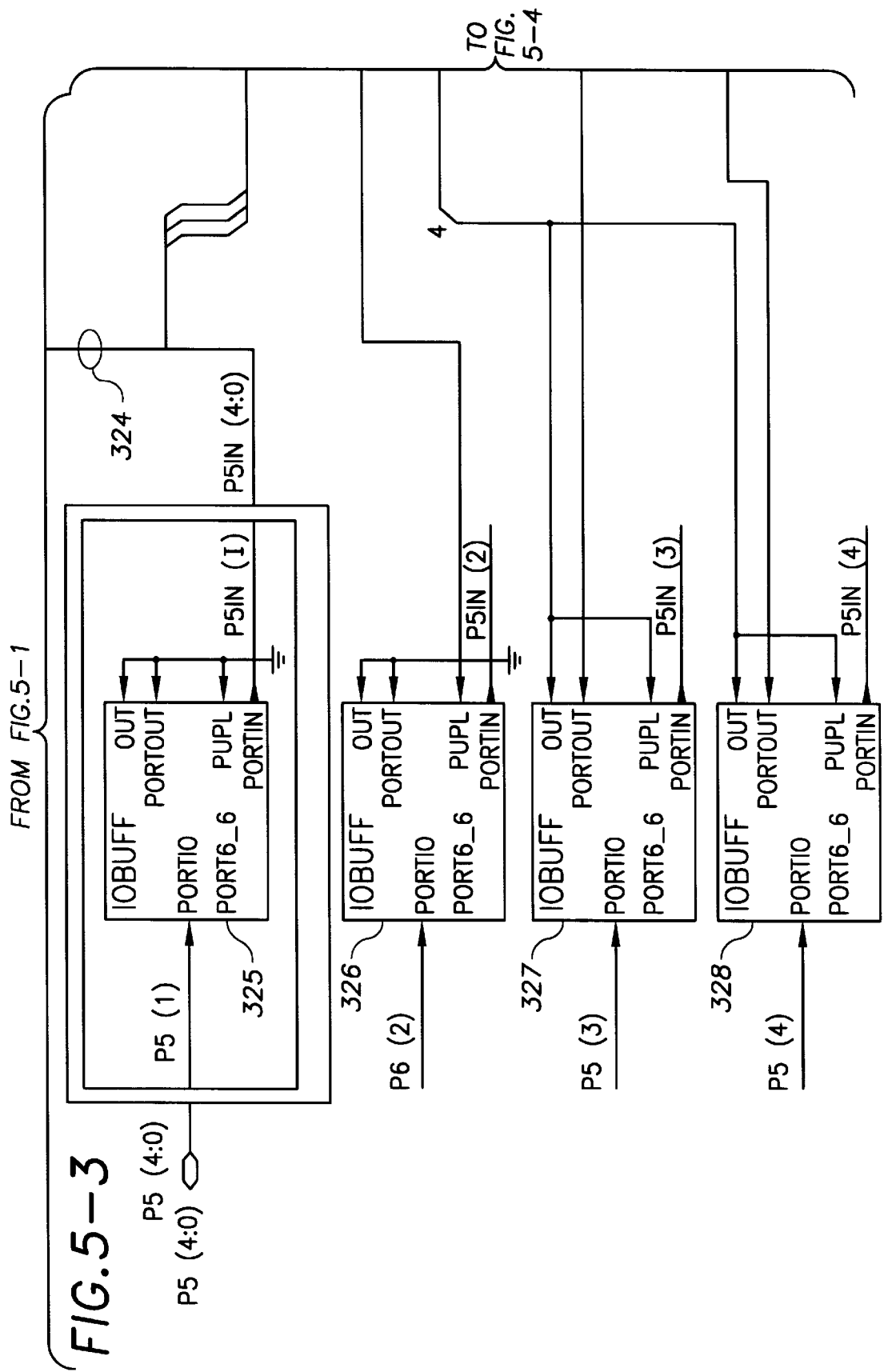

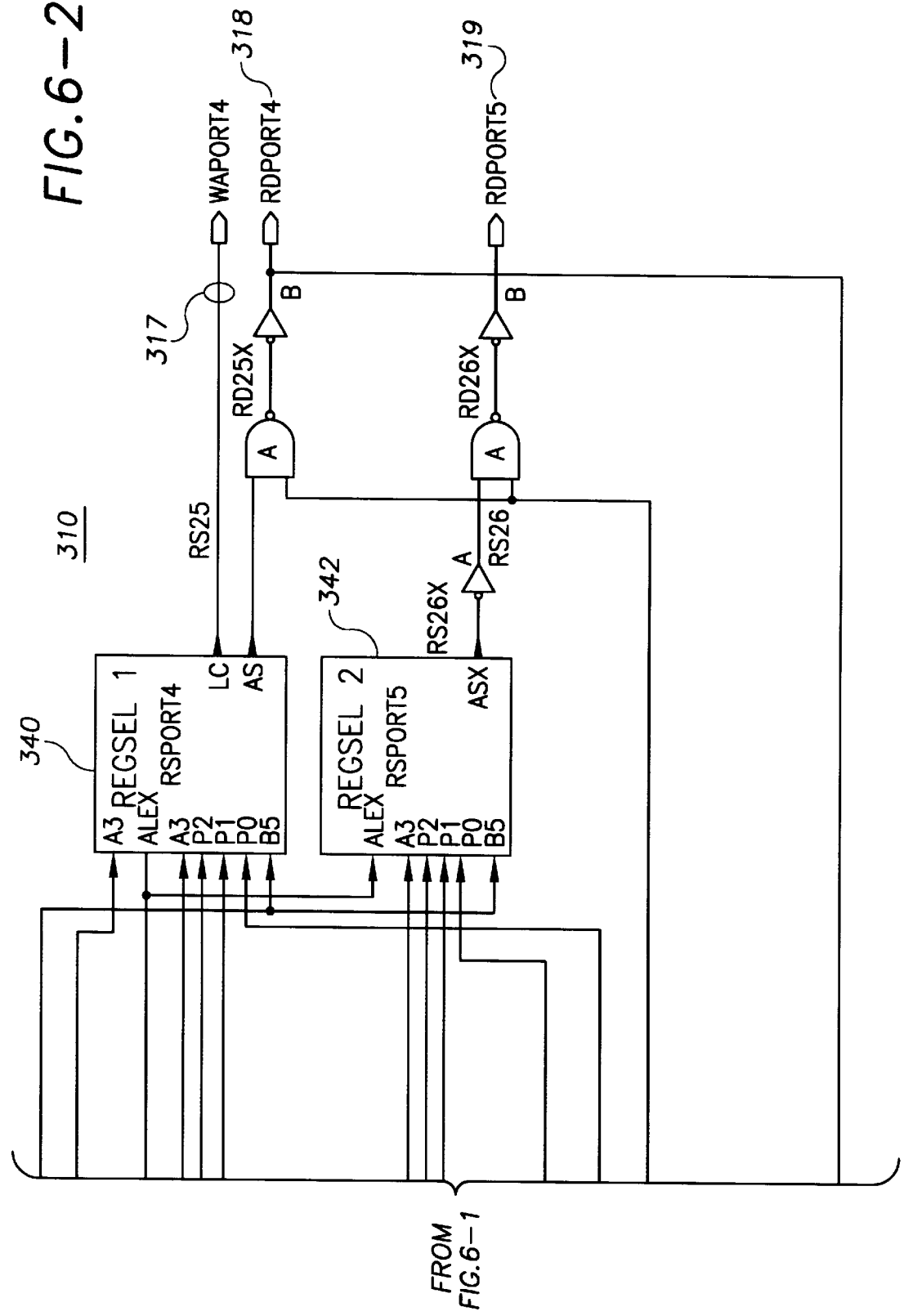

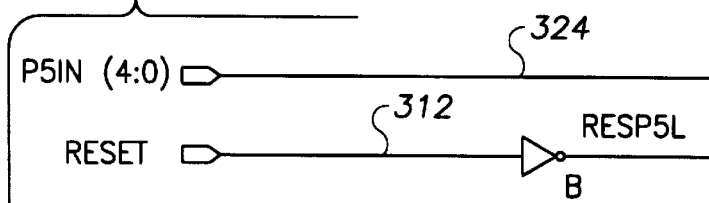
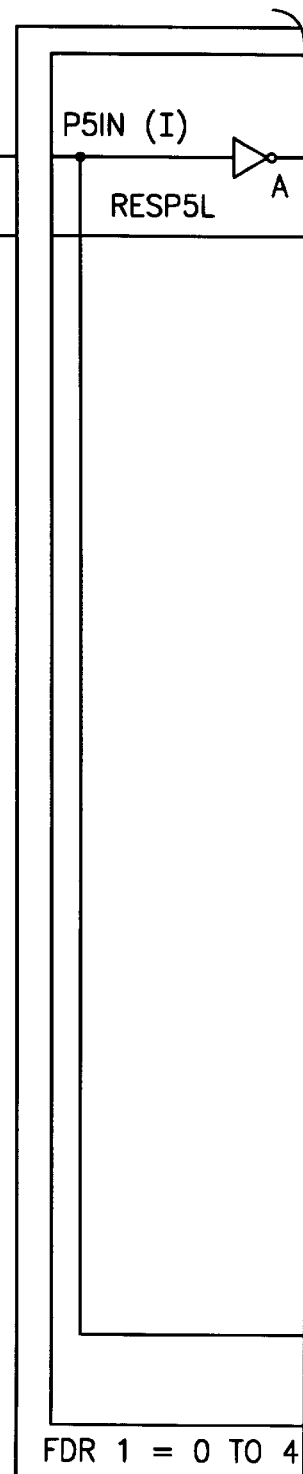
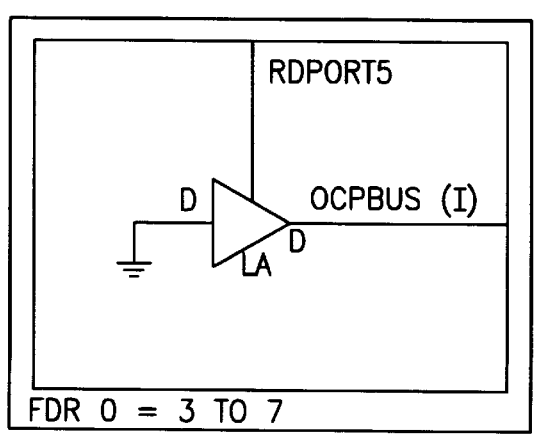
FIG. 8-1

NARROWBAND DIGITAL CORDLESS TELEPHONE WITH A LOGIC HIGH WEAK DRIVER AND A LOGIC LOW STRONG DRIVER FOR KEYPAD INTERFACE

BACKGROUND OF THE INVENTION

The invention relates to electronic communications, and more particularly, to a narrowband digital cordless telephone baseband chip for use in a hand unit or base unit of a digital cordless telephone.

Typical cordless telephones are known in the art. Advances in cordless telephony are continually being made, however, and those advances are often significant. Certain types of cordless telephones may operate digitally. Those digital cordless telephones may provide greater quality and capabilities than analog devices.

Cordless telephones are popular with residential and individual consumers. As cordless telephone technology advances, cordless telephones may prove advantageous to other consumers as well, such as businesses and commercial groups. When cordless telephones are designed for the lower-end residential and individual consumer market, price and quality are primary considerations of those consumers. Digital telephones tend to provide greater quality of sounds and capabilities than analog telephones. It is desirable, therefore, that a digital cordless telephone of good quality and adequate capabilities be available to that lower-end market.

In addition to quality, the cordless telephone market is particularly price conscious. Low-end consumers, such as residential and individual users, particularly look for economy. Although various designs of digital cordless telephones may be available, those designs have not adequately met the consumer's need for quality as well as economy. A digital cordless telephone that meets those expectations of consumers, thus, would provide significant improvement and advance in the technology.

Beyond those two expectations of quality and economy of cordless telephone consumers, residential and individual cordless telephone users must typically operate within a narrow bandwidth. Such a narrow bandwidth presents problems that must be addressed by digital cordless telephone designers. For example, within the narrow bandwidth, multiple users may need to simultaneously communicate. In order to avoid interference among users and inaccurate communications in those cases, designs of digital cordless telephones must provide for multiple users. The designs must also meet the market requirements of quality and low price.

Prior cordless telephones required the software of the phone to guess which key was intended when a user hit multiple keys on different rows or columns. The software often guessed the wrong number, or interpreted the action as neither key being pressed, resulting in either an incorrect phone number being dialed, or no phone number being dialed.

Therefore, what is needed is an economical and quality digital cordless telephone which enables desired communications over a narrow bandwidth, and which does not require the telephone software to guess about keypad switch closures.

SUMMARY OF THE INVENTION

In one embodiment, the invention is a digital cordless telecommunications unit that receives and transmits analog voice signals. In addition, the unit transmits digital baseband signals and receives digital formatted baseband signals. The unit includes a baseband chip, as well as an audio functions block and a system control functions block. The audio functions block comprises an audio front end for receiving and transmitting the analog voice signals and an adaptive differential pulse code modulator codec, connected to the audio front end. The codec converts the analog voice signals to the digital baseband signals and converts the digital formatted baseband signals to the analog voice signals for transmission. The system control functions block comprises a microcontroller connected to the codec for controlling the baseband chip, a memory accessible by the microcontroller for storing control instructions, an interrupt controller connected to the microcontroller, a parallel port connected to the interrupt controller, a wake-up timer connected to the interrupt controller, a clock generator connected to the microcontroller, and a synchronous serial port connected to the interrupt controller.

DESCRIPTION OF THE PREFERRED EMBODIMENTS

Figure 1:
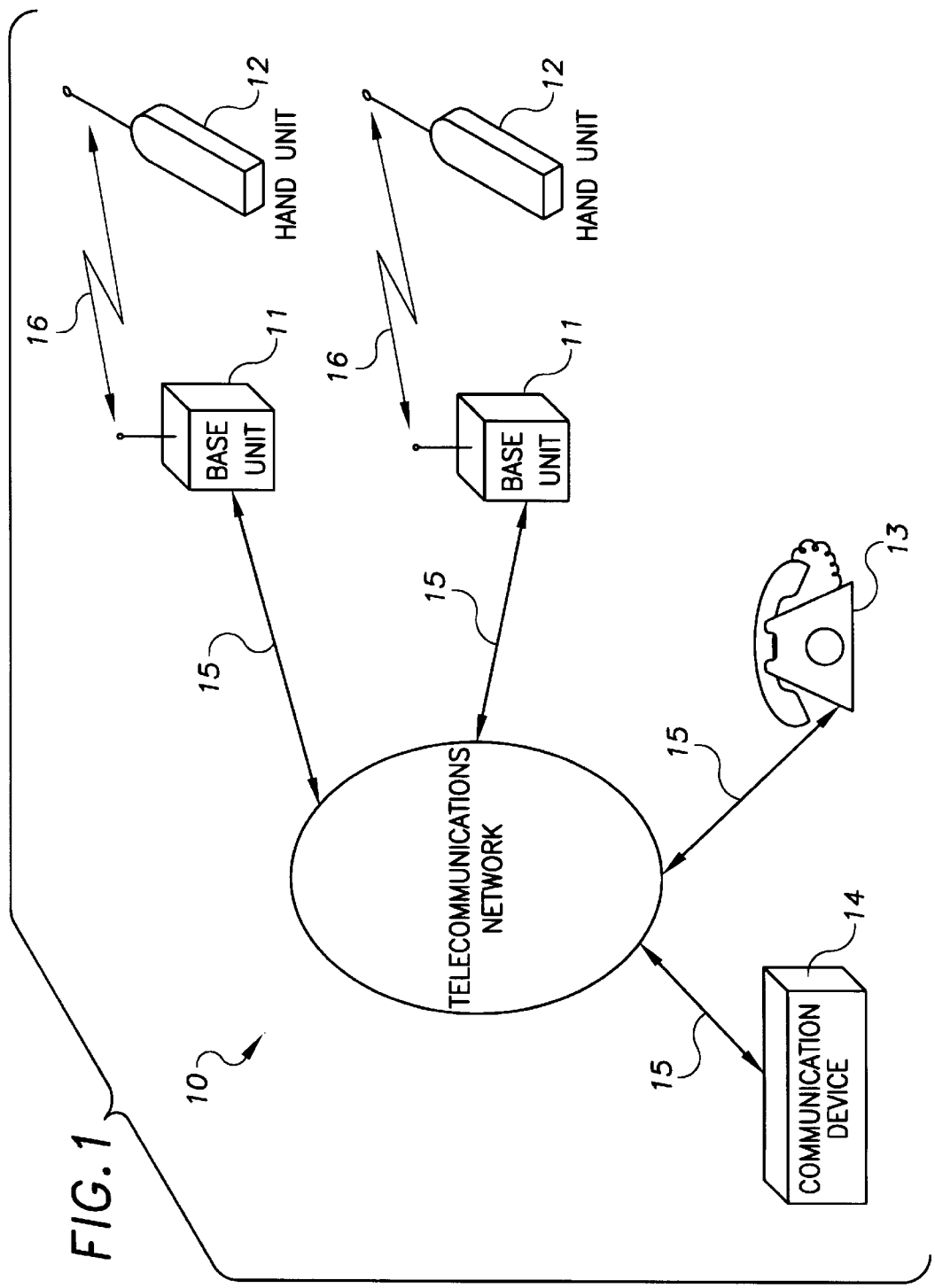
FIG. 1 is a schematic view of a telecommunication system connected with several communications units, including a base unit and a hand unit of a digital cordless telephone according to certain embodiments of the present invention.

Referring to FIG. 1 of the drawings, several telecommunications devices are connected to and form a telecommunications network 10. The telecommunications network 10 is typically a PSTN (Public Switched Telephone Network), although an ISDN (Integrated Services Digital Network) or other network may also be an application for the embodiments of the invention. For purposes of example only, the illustration of the telecommunications network 10 shows, in particular, base units 11 of two digital cordless telephones wire-linked with other portions of the telecommunications network 10. Each of the base units 11 has a particular hand unit 12 with which the base unit 11 is in radio frequency (RF) communication. Also, for purposes of example, the telecommunications network 10 is shown to include a typical corded telephone 13 and another telecommunications device 14, which may be, for example, a communications device such as a facsimile machine, a modem for a computer, or some other device. Each of the devices 11, 13, 14 is connected to the telecommunications network 10 by a network link 15, which may, for example, be a wired-ink, an optical fiber link, a radio link, or some other communications link.

The Digital Cordless Telephone

Each of the digital cordless telephone devices of the illustrated embodiment comprises one base unit 11 and one corresponding hand unit 12. The base unit 11 and corresponding hand unit 12 communicate over RF. The base unit 11, being tied by the network link 15 with the telecommunications network 10, receives communications from the network 10 and passes communications to the network 10. Because the base unit 11 and hand unit 12 are capable of passing communications information back and forth between the units 11, 12, communications from the telecommunications network 10 may be passed to the hand unit 12 and passed from the hand unit 12 to the telecommunications network 10, each via the base unit 11 and the link 15.

Typically, the base unit 11 of a cordless telephone is virtually immobile, or at most mobile over very limited range, because of the fixed physical length of the network link 15 to such unit 11. The same is true of the typical corded telephone 13 and other telecommunications device 14 because each is linked to the network 10 by a fixed physical length connector, such as a wire, optical fiber, or other equipment, which serves as the network link 15. In the illustration of FIG. 1, it is of note that in comparison to the corded telephone 13, communications device 14, and base unit 11, the hand unit 12 may have much greater mobility. This is so because the hand unit 12 is mobile with respect to the base unit 11 and unimpeded by a fixed physical length connector such as the link 15. Instead of such a connector, communications between base unit 11 and hand unit 12 occur over the RF link 16. Although there are typically distance limits to communication over the RF link 16, the RF communications between base unit 11 and hand unit 12 over the RF link 16 may generally be accomplished at greater and varied distances between base unit 11 and hand unit 12 in comparison to the fixed physical length connector employed as the network link 15 in other types of devices. Such an RF link 16 between base unit 11 and hand unit 12, versus some other physical network link 15, such as a fixed length wire, thus provides much greater flexibility of use of the hand unit 12 at varied locations during communications.

Although variations and improvements are continually being made in cordless telephone devices 11, 12, such as those illustrated in FIG. 1, embodiments of the present invention will be applicable to many of those variations and improvements. Certain variations and improvements in the cordless telephone devices 11, 12 could include, for example, multiple hand units 12 communicating with a single base unit 11, hand unit 12 communications capability with any one of a group of base units 11 capable of such communications, when in the vicinity of a base unit 11 of the group, office branch exchanges or intercom systems with multiple hand units 12 communicating with one or more base units 11, and others. Although the embodiments of the present invention expressly described herein are discussed primarily in reference to a configuration of one base unit 11 being dedicated to a single hand unit 12, and vice-a-versa, the descriptions should not be considered limited to that configuration. As those in the art will readily appreciate, multiple variations, with various advantages and attributes of each, are possible.

The Base Unit and the Hand Unit

Figures 2, 3:
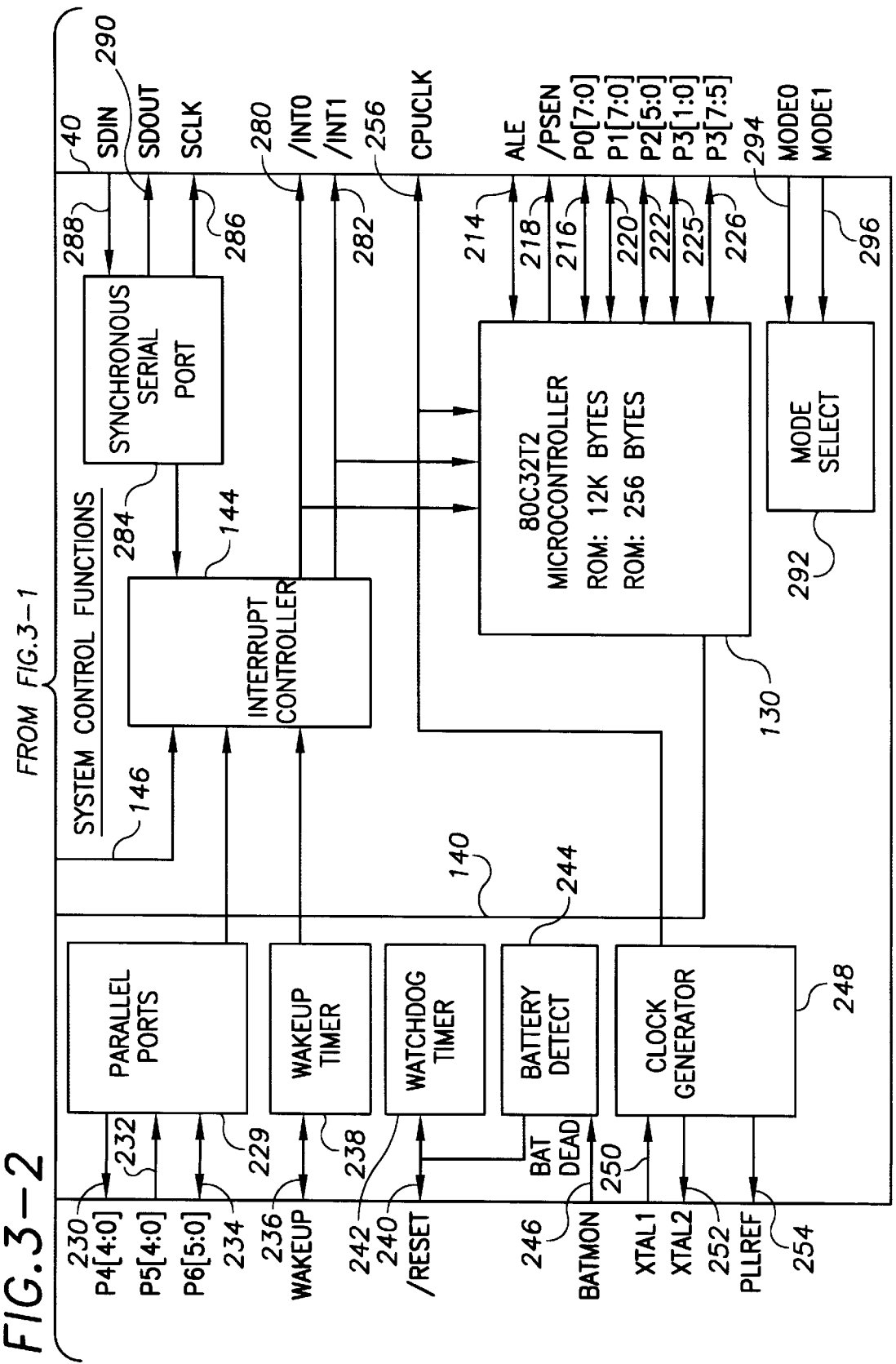
FIG. 2 is a schematic illustration of certain elements within the base unit and hand unit of FIG. 1, which elements may be employed in both the hand unit and the base unit.
FIG. 3 is a block diagram of functional blocks of an embodiment of a baseband chip which may be employed in a base unit or hand unit of a digital cordless telephone.

Now referring to FIG. 2, a cordless telecommunications unit 20, which may be either a base unit 11 or a hand unit 12, includes two main parts. The two parts are a baseband chip 22 and a radio 24. The baseband chip 22 may include a variety of devices, such as controllers, codecs, and formatters. The baseband chip 22 may be a single semiconductor chip, some other integrated circuit, or other circuitry. The radio 24 may also include various functionalities, such as, for example, various oscillators, up and down converters, synthesizers, and antennas. As with the baseband chip 22, the radio 24 may be a semiconductor device, another integrated circuit, or other circuitry. A particularly desirable cordless telecommunications unit 20 comprises a baseband chip 22 which operates at CMOS-levels and transmits and receives various signals to and from the radio 24 at those levels. The radio 24 of such a desirable unit 20 converts RF signals to and from the CMOS-level baseband signals of the baseband chip 22 to enable RF communications among corresponding base units and hand units 11, 12.

Although not detailed herein because not necessary to an understanding of the embodiments of the present invention and, in any event, generally known to those skilled in the art, the cordless telecommunications unit 20 may be equipped with various peripherals (not shown) in order to allow appropriate usability and desired operations. The peripherals may include, for example, matters such as power, power controls, keypads, touch keys, on/off controls, speakers, LCDs, transducers, such as microphones and ear pieces, and other peripheral elements. In order to function as a digital cordless telephone, the telecommunications unit 20 must be equipped with a variety of those peripherals and others, as those skilled in the art will know and appreciate.

Figure 4:
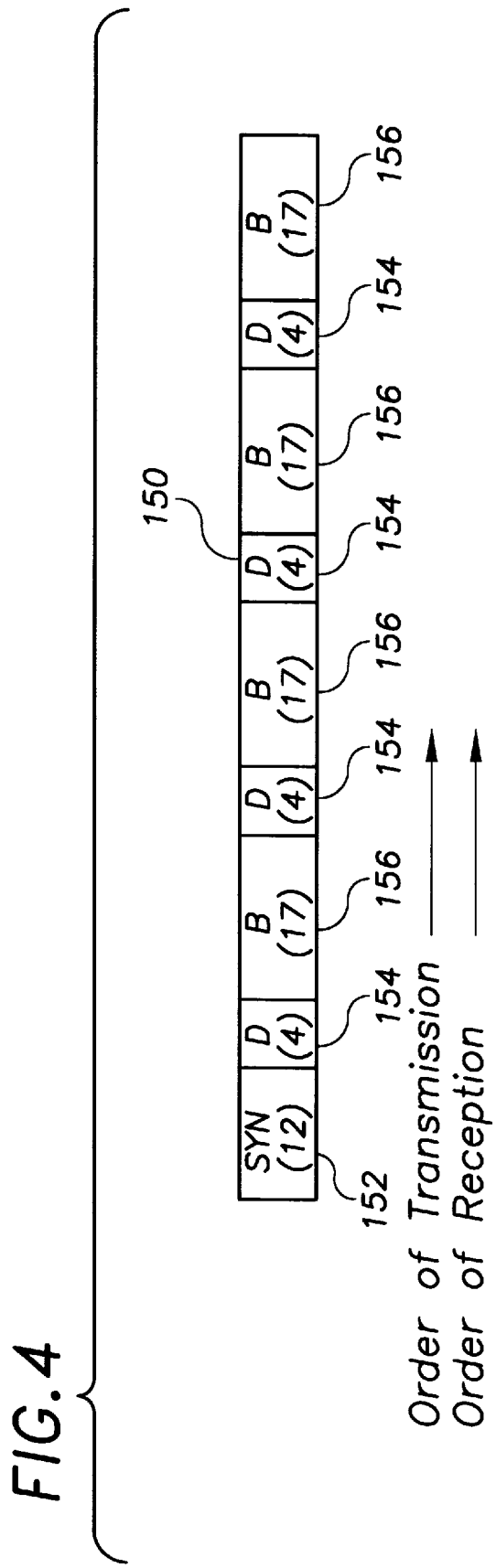
FIG. 4 is a multi-channel frame format, according to certain embodiments of the present invention, which frame format may serve for desired transmissions and receptions of communicated information in a digital cordless telephone comprised of a base unit or a hand unit, according to embodiments of the invention.

The cordless telecommunications unit 20 communicates with its complementary cordless telecommunications unit 20', which is the other of either the hand unit 12 or base unit 11, depending upon whether the unit 20 is the base unit 11 or hand unit 12, respectively. In an embodiment of the invention, communications between the baseband chip 22 and the radio 24, and also between the cordless telecommunications unit 20 and its complementary cordless telecommunications unit 20', occur over three logical channels: a framing synchronization SYN-channel 152; an error-control, packetized control D-channel 154; and a transparent voice B-channel 156 (the channels are illustrated in FIG. 4). This three-channel format is followed in communications between the baseband chip 22 and the radio 24 and in communications between units 20, 20'. The communications between the baseband chip 22 and the radio 24 are shown as a transmission signal 226, for baseband transmit signals, and a receive signal 228, for baseband receive signals. The reference clock output 254 provides a synthesizer reference clock derived from a crystal (not shown) for use by the radio 24 in modulating the carrier. The transmit baseband signal 226 and the receive baseband signal 228 are modulated over a desired carrier channel at the radio 24 and transmitted and received over radio frequency through the RF link 16. Either the unit 20 or unit 20' is connected with the telecommunication network 10 as previously described in reference to FIG. 1. The particular three-channel format described is intended only as an example format with which the units 20, 20' can communicate. The baseband chip 22 of each of the units 20, 20' is suitable for operation using a variety of channel formats, as those skilled in the art will know and appreciate.

The Baseband Chip

Referring now to FIG. 3, a functional block illustration of an embodiment of the baseband chip 22 is shown. As shown in the figure, the baseband chip 22 includes three basic functional blocks. Those functional blocks are a system control functions block 40, an audio functions block 42, and a protocol functions block 44. Each of the blocks 40, 42, and 44 contain various functional elements. The functional elements will later be described in greater detail. Generally, the system control functions block 40 controls all operations of the chip 22. System control is implemented by a microcontroller 130 through software and hardware. Software for the microcontroller 130 may be provided, for example, by a mask-programmable read only memory (ROM) (not shown) or some other source. The audio functions block 42 enables input and output of analog audio signals, such as a user's voice, rings, and dual tone multifrequency (DTMF) signal tones. The protocol functions block 44 enables the particular communications between base unit 11 and hand unit 12 (shown in FIG. 1) according to a particular protocol or format, as previously mentioned, that enables quality and accurate signal communications between those units 11 and 12.

The External Interfaces

A. Audio Functions Block 42

In order to better understand the functional blocks 40, 42, and 44, and their functional elements and components, it is helpful to know the external interfaces of the baseband chip 22. Beginning with the audio functions block 42, the external interfaces of the baseband chip 22 at that block 42 include two audio input and output interfaces. The first is an audio in (AIN) 200 interface for delivery of voice (or other analog audio) signals to the unit 20 (FIG. 2). The other interface consists of two pins, an audio output (AOP) pin 202 and an audio output (AON) pin 202, which together form a differential audio output pair from the audio front end 302 of the chip 22. The audio front end 302 is connected internally to an adaptive differential pulse code modulator (ADPCM) codec 124. The ADPCM codec 124 may also include DTMF generation functions. The audio functions block 42 interfaces externally with a ringer through a RING interface 204 of a digital ringer 300. The digital ringer 300 may, for example, be a digitally programmable ring-tone generating circuit that alerts of incoming calls. Additionally, the audio function block 42 includes certain biasing signal interface, such as a reference current output (RIEF) signal 206 and a $V_{CC}$ DC bias filter (CFILT) pin 208, that connect with a biasing component 304 of the chip 22. The biasing component 304 produces bias voltage on the pin 208 and a reference current signal 206.

B. Protocol Functions Block 44

The protocol functions block 44 includes several external interfaces. Those external interfaces include a baseband transmit signal ($T_{XBB}$) 226 and a receive baseband signal ($R_{XBB}$) 228. The ($T_{XBB}$) signal 226 and the ($R_{XBB}$) signal 228 are each digital signals, transmitted to and received from, respectively, the radio 24 (shown in FIG. 2). The protocol functions block 44 may also include external interface pins TST0 and TST1 210 for testing and development purposes. The TST0 and TST1 pins 210 allow the user to drive each of the interface pins 210 to one of four levels. Based on each particular level of the TST0 and TST1 pins 210 a certain bank of diagnostic outputs appear on a MON [3:0] bus 212. The chips 22 may, thereby, be tested via the interface pins 210 and the bus 212 for quality assurance purposes.

C. System Control Functions Block 40

The system control functions block 40 includes a microcontroller 130 which externally interfaces through an address-latch-enable (ALE) pin 214. The ALE pin 214 is a timing strobe that demultiplexes a Port 0 (P0[7:0]) bus 216. The ALE signal 214 serves to latch a lower order address on the Port 0 bus 216 during external accesses by the microcontroller 130. Another external interface of the microcontroller 130 is the program store enable (/PSEN) strobe 218. The /PSEN strobe 218 is an active low read strobe to external program memory (not shown), allowing fetch from that external memory device. The Port 1 (P1[7:0]) 220 bus is an 8-bit input/output (I/O) general purpose port with internal pull-ups. The Port 1 bus may be used, for example, for control and for status of various externally attached devices. A Port 2 (P2[5:0]) bus 222 serves as an address output bus, particularly, as an upper order address byte during fetches from program memory and during access to certain external data memory. A Port 3 [1:0] (P3[1:0]) bus 224 serves as I/O ports. Port 3 [1:0] 224 is an asynchronous serial port, as well as a general purpose port. Using Port 3 [1:0] 224, two signals may be ported and used for either testing the baseband chip 22 or the end product telephone communications unit 20, 20', either hand unit or base unit, as the case may be (FIG. 2), or, for communicating other information while the hand unit 20 or 20', as the case may be, is sitting in a telephone cradle (not shown). Such a port as Port 3 [1:0] 224 may be useful, for example, for passing security codes so that periodically one unit 20 or 20' may generate a random new security code, pass it to the other unit 20' or 20, and so secure communications. The ports of Port 3 [1:0] 224 have internal pull-ups. The other external interface of the microcontroller 130 is a Port 3 [7:6] (P3 [7:6]) 225 which serves as an active low external data memory write strobe and as an active low external data memory read strobe.

The system control functions block 40 also externally interfaces through other connections not directly associated with the microcontroller 130. These interfaces include certain parallel ports 229. Of these parallel ports 229, Port 4 (P4[4:0]) 230 is a weak pull-up strong pull-down output port which drives a value that is programmed in a port 4 register 320 (FIG. 5) and retains that value when the chip 22 goes into shutdown mode. Another one of those ports 229, is Port P5 (P5[4:0]) 232 which is an input port with an internal weak pullup which can be read in a Port 5 register 323 in FIG. 5. Any change in the Port 5 232 value generates a keyscan interrupt. Both Port 4 230 and Port 5 232 serve as a keyscan interface. In effect, when a typical keypad key (not shown) depression is detected by a typical keypad scanner (not shown) attached with Port 4 230 and Port 5 232, the Port 4 pin 230 is shorted to the Port 5 pin 232 and brings the Port 5 pin 232 to a different level. That causes an interrupt that propagates through the interrupt controller 144 and on to the microcontroller 130. The microcontroller 130 then operates on the Port 4 pin 230 in a sequence of steps to determine the exact key closure for the keypad array. The final port of the parallel ports 229 is Port 6 (P6[5:0]) 234. Each bit in Port 6 234 is individually configurable as an input, with or without a pull-up, or as an output as a Port 6 register (not shown). Port 6 234 is a radio 24 (shown in FIG. 2) control port. The microcontroller 130, through Port 6 234, controls certain functions of the radio 24, for example, power on/off and others.

Other external interfaces of the system control functions 40 block include a synchronous serial port 284. This port 284 also serves to control part of the radio 24 (shown in FIG. 2). In general, channel selection in digital cordless telephones is made by a programmable synthesizer (not shown) of the radio 24. That programmable synthesizer is basically a prescaler that takes a high frequency and divides it by a number programmed into the radio 24. The synchronous serial port 284 is the interface over which that programming may be accomplished. As for the specific external connections of the synchronous serial port 284, that port 284 includes a serial port clock (SCLK) output pin 286, a serial port data input (SDIN) pin 288, and a serial port data output (SDOUT) pin 290. Example uses of the synchronous serial port 284 are attachment of the baseband chip 22 with EEPROM devices for purposes of retention of identification information or attachment to a programmable synthesizer employed for radio 24 channel selection.

One other pin of the system control functions block 40 of the baseband chip 22, a PLL reference (PLLREF) pin 254, also is associated with the radio 24. The PLLREF pin 254 is a clock-related signal from the clock generator 248. Through the pin 254, the clock generator 248 supplies the synthesizer of the radio 24 with a divided clock signal.

Other external interfaces of the system control functions block 40 may serve other purposes, for instance, power control. Optimizing power use by reducing consumption when the unit 20 or 20' is idle is an important objective in digital cordless telephones, because those devices are typically battery powered. Several of the external interfaces serve to keep down power consumption. One of those interfaces is with the wake-up timer 238. The wake-up timer 238 serves to periodically wake-up the unit 20 or 20' from an idle state in order to check for incoming signals. The wake-up pin 236 serves to interface the wake-up timer 238 with the radio 24, and vice versa, to wake-up and detect notify. The /RESET pin 236 may be attached to a passive RC circuit (not shown in detail) which forms a multi-vibrator. The watchdog timer 242 of the chip 22 serves in that regard to discharge the capacitor of that passive RC circuit and then, the capacitor through the RC time constant charges again until it again reaches a certain level that triggers the circuit to discharge again. This cycle is repeated to form a clock. The wake-up timer 238 includes a counter chain that counts the clock cycles. Upon reaching a certain count, the wake-up timer 238 then issues an interrupt.

Other interfaces of the system control functions block 40 include a reset (/RESET) pin 240 that connects with the watchdog timer 242 and a battery detector 244 of the chip 22, and a battery monitor (BATMON) pin 246 that also connects with the battery detector 244 of the chip 22. The battery detector 244 serves to detect the power level of a battery (not shown) supplying the unit 20 or 20', as the case may be. The battery detector 244 may control the unit 20 or 20' to prevent operations when the battery power reaches a critical, minimum level. In such an event, the /RESET pin 240 serves to send a notifying signal to the radio 24 and halts operations of the chip 22. The battery monitor (BATMON) pin 246 provides a connection to the battery, and the battery detector 244 detects the battery power through the pin 246. In addition to serving to prevent operations at low battery levels, the battery detector 244 works in a trickle charger (not shown). The hand unit 20 or 20', as the case may be, comprising the baseband chip 22 could be placed in its cradle and the battery charged by a charger. The battery detector 244 may, in that instance, serve to detect a high battery level. When a critical, maximum battery power level is so detected, then the battery detector 244 may alert the microcontroller 130 and the microcontroller 130 can operate to disable the charging circuit. Even more, the battery detector 244 may alert the microcontroller 130 when the battery power level has reached some standard low level, but not yet the critical, minimum level, and the microcontroller 130 may operate to cause a warning to the user of the low battery level.

Further discussing the watchdog timer 242 in these respects, the watchdog timer 242 operates continuously to check that software of the baseband chip 22 continues to service the watchdog timer 242 within a given timeout period, according to design. The timeout period may, for example, be about 0.9 seconds or some other period. The /RESET pin 240 connected to the watchdog timer 242 may serve for application, by the watchdog timer 242, of a strong pull-up to $V_{CC}$. This facilitates software development without intervention of watchdog timer 242 induced reset. Software routines which service the watchdog timer 242 may be included or omitted from the software executed during development. This allows operation of the chip 22 without watchdog timer 242 reset occurrence, such as may be desired in software and service development.

Further, the system control functions block 40 includes a clock generator 248 which provides clock signals for the baseband chip 22 and for overall timing and synchronization of the entire unit 20, 20' (shown in FIG. 2). The clock generator 248 externally interfaces via a crystal input (XTAL 1) signal 250 and a crystal output (XTAL 2) signal 252. Also, as previously mentioned, the clock generator 248 externally supplies a phase lock loop, i.e., a synthesizer, of the radio 24 (shown in FIG. 2) with a clock frequency (PLLREF) 254, derived from the crystal frequency of the clock generator 248. The clock generator 248 also supplies internally to the microcontroller 130 a clock signal (CPUCLK) 256, which CPUCLK signal 256 is also available through an external interface.

Other external interfaces of the system control functions block 40 may include interrupt signals, such as the /INT0 280 and the /INT1 signal 282 which are each indicative of the status of internal interrupts from the interrupt controller 144. Finally, the baseband chip 22 may include certain external interfaces for mode selection by a mode selector 292. The external interfaces to the mode selector 292 may include a MODE0 pin 294 and a MODE1 pin 296. The mode selector 292 provides for four possible modes because of the two pins 294, 296. One mode is the execution by the microcontroller 130 of code that is resident in memory (not shown) contained within the chip 22, such as a mask-programmable ROM, possibly, a 12 kbyte memory. Another of the possible modes may allow for microcontroller 130 execution of code from a memory (not shown), such as RAM external to the chip 22. Yet another mode may disable the microcontroller 130 completely and attach all the external interfaces 214, 218, 216, 220, 222, 225, 226 of the microcontroller 130 to an in-circuit emulator for code development or other purposes. A fourth mode may be a test mode, for example, to allow production testing of the chip 22 at various stages of manufacture. Of course, the modes could provide alternative possibilities.

Beyond these, other external interfaces of the baseband chip are possible and may be appropriate in certain applications. The particular external interfaces specifically described here are intended to be understood as examples only and other such interfaces may be possible.

The Internal Interfaces

Continuing to refer to FIG. 3, internal interfaces between the functional blocks 44, 42, 40 of the baseband chip 22 and between the protocol functions block 44 and the radio 24 (shown in FIG. 2) may be discussed. In general, there are four primary "internal" interfaces to the protocol functions block 44. Each of those interfaces connects with the frame formatter 112 of the protocol functions block 44. The four interfaces are: (1) a radio interface 114, connecting the frame formatter 112 with the radio 24 (shown in FIG. 2) of the telecommunications unit 20 or 20' (also shown in FIG. 2); (2) a FIFO/codec interface 128, connecting a FIFO element of the frame formatter 112 with a codec 124, such as an ADPCM codec, of the audio functions block 42; (3) an interrupt interface 146, connecting the frame formatter 112 with an interrupt controller 144 of the system control functions block 40; and (4) a microcontroller interface 140, connecting the frame formatter 112 with a microcontroller 130 of the system control functions block 40. These four internal interfaces with the frame formatter 112 of the protocol functions block 44 enable operations of the baseband chip 22 when a frame format, such as, for example, a multiple logical channel format like the format 150 (shown in FIG. 4, and hereinafter discussed) or some other format for transmitted and received data is employed in communications.

Turning now to discussion of each of the four interfaces 114, 128, 146, 140 in greater detail, particular aspects and characteristics of the interfaces 114, 128, 126, 140, as they operate to enable desirable communications utilizing a frame format, for example, the format 150 shown in FIG. 4, may be better understood. Beginning with discussion of the radio interface 114, the radio interface 114 comprises a transmit ($T_{XBB}$) bus 226 and a receive ($R_{XBB}$) bus 228. These buses 226, 228 allow the baseband chip 22 to communicate baseband signals with the radio 24 (shown in FIG. 2) of the cordless telecommunications unit 20 or 20', as the case may be (FIG. 2). The baseband signals may be communicated according to a desirable frame format therefor, such as, for example, the three logical channel format 150 (FIG. 4). The buses 226, 228 may, for example, be configured to operate in a serial manner.

Turning now to the microcontroller interface 140, the microcontroller interface 140 directly connects the microcontroller 130 with certain registers (not shown in detail) of the frame formatter 112. Those registers may be supplied with certain information by the microcontroller, via the microcontroller interface 140. The information maintained in those registers may be used at the frame formatter 112 to control the formatter 112 operation. Software may, for example, cause the microcontroller 130 to write certain valuables to the registers. Those values, then, control the formatter 112 operations. The values may dictate the start of transmission, the synchronization pattern to be detected, the data to be transmitted over certain logical channels, or other matters at the formatter 112.

Now addressing the interrupt interface 146, the interrupt interface 146 directly connects an interrupt controller 144 with the frame formatter 112. The frame formatter 112 may pass interrupt signals on status bits to the interrupt controller 144 over the interrupt interface 146. The interrupt signals and status bits passed over the interrupt interface 146 may serve a variety of purposes, as those skilled in the art will know and appreciate. Certain particular reasons those signals and bits may be sent by the formatter 112 to the interrupt controller 144 may include, for example, to indicate conditions of signals at the radio interface 114 or other conditions or matters.

Now referring to the FIFO/codec interface 128, the FIFO/codec interface 128 serves to interface a FIFO element (not shown in detail) of the frame formatter 112 with the codec 124, which, for example, may be an adaptive differential pulse code modulator (ADPCM) codec. The FIFO/codec interface 128 provides for passage of data, for example, B-channel data 156 (shown in FIG. 4 and discussed below), between the FIFO element of the formatter 112 and the codec 124. Such data may be passed both ways across the interface 128. The FIFO element, in such embodiment, may serve as a buffer between the codec 124 and the frame formatter 112. The FIFO element may also, according to certain embodiments, accept clock timing adjustment information from the frame formatter 112. Based on such information, the FIFO element may enable corrections to the internal clocks generated by the formatter 112. Corrected internal clocks may, for example, be passed over the FIFO/codec interface 128 to the codec 124 and employed to keep the chip 22 synchronized.

Further discussing the codec 124, the codec 124 serves to convert analog audio data to digital data bits, for example, an ADPCM codec may, upon the conversion, yield 32 kbps ADPCM data bits, and vice versa. The codec 124 may be responsive to a muting signal serve to mute the receiver unit 20 or 20', as the case may be, under conditions of detected bit errors in the ADPCM voice path. The codec 124 may also allow real-time read-only access to the voice path to facilitate hands-free operation. In such operation, the microcontroller 130 may interact with the programmable voice path gain stages and thereby control chip 22 operations in accordance therewith.

The Frame Format

Referring to FIG. 4, pursuant to these embodiments of the interfaces 114, 128, 140, 146 of the frame formatter 12 of the baseband chip 22, a multichannel data format, for example, the format 150, may be transmitted and received by the frame formatter 12 in a desired manner. The multichannel data format, for example, the format 150, may comprise several distinct logical channels, such as, in the case of the format 150, three logical channels. In the example format 150, the three logical channels are: a transparent voice B-channel 156, an error-control, packetized control D-channel 154, and a framing synchronization SYN-channel 152. Such a three channel format 150 may be followed in communications between the baseband chip 22 (FIGS. 2 and 3) and the radio 24 (FIG. 2) of a cordless telecommunications unit 20 (FIG. 2). That three channel format 150 could also be followed in RF communications units 20, 20' (FIG. 2), such as, for example, the base unit 11 and the hand unit 6 of a digital cordless telephone (FIG. 1).

In the case of the particular frame format 150, each such format 150 comprises an initial SYN-channel 152 of data which contains a fixed synchronization pattern (not shown) for timing recovery and frame alignment. The SYN-channel 152 data allows the receiving radio 24 (shown in FIG. 2) to synchronize with the frame formatter 12 during transmission, and the frame formatter 12 to synchronize with the radio 24 during reception. Following the SYN-channel 152, the D-channel 154 and then the B-channel 156 alternate in four packets each. The D-channel 154 is control data for non-audio, system communications. The B-channel 156 is audio data, such as voice data. There are instances, however, when the B-channel 156 is not used. In those instances, the $T_{XBB}$ bus 226 can run asynchronously, giving added flexibility to the frame formatter 12 and the radio 24 (shown in FIG. 2) to either speed up or slow down the transmission rate.

Further with respect to the particular frame format 150, the format 150 may be 96-bits at a bit rate of about 48 kbps.

Within each such 96-bit frame format 150, those bits exist in the three channels, i.e., the SYN-channel 152, the D-channel 154, and the B-channel 156. Of those channels 152, 154, 156, the SYN-channel 152 comprises a programmable 12-bit sequence transmitted consecutively once per 96-bit frame. Transmission may be so consecutive to facilitate robust frame synchronization between units 20, 20'. The D-channel 154, then, comprises 16-bits, allocated in four distinct 4-bit time slots, distributed throughout the frame format 150. Such a distribution minimizes B-channel 156 delay and DC balance. As for the B-channel 156, it comprises sixteen 4-bit ADPCM words, distributed in four groups of four words, each of the four groups occupying distinct time slots after a D-channel 154 time slot. Each of the groups of B-channel 156 words has an associated parity bit for the purpose of allowing for detection and response to bit errors in the received voice B-channel 156 signal. The particular alternating structure of D-channel 154 bits, followed by B-channel 156 bits, of the frame format 150 facilitates robust data and timing recovery. The SYN-channel 152 data is employed by units 20, 20' in synchronizing the units 20, 20'. The particular criteria for acquisition and loss of synchronization of the units 20, 20', by virtue of the SYN-channel 152 information, is a programmable parameter. The microcontroller 130 may configure the parameter for optimal operations with respect to linking appropriate units 20, 20' for legitimate communications therebetween and tolerating temporary radio 24 fades.

The Frame Formatter

Now referring to FIGS. 1–4, in conjunction, the frame formatter 12 of a unit 20 receives data streams of the form of a format, such as a multichannel format, for example, the frame format 150, and then determines the transmission rate of the received data stream. Once the transmission rate is determined, each of the SYN-channel 152 data packet, the D-channel 154 data packets, and the B-channel 156 data packets are extracted and registered by the frame formatter 112. The frame formatter 112 also delivers data streams of the form of a format, such as the frame format 150, to the radio 24 of the unit 20 when transmitting to another unit 20'.

In operation of the frame formatter 112, voice and control data to be transmitted from the radio 24 (shown in FIG. 2) is assembled, formatted, and emitted and digital receive data from the radio 24 is channeled into separate voice and control streams. Those separate voice and control data streams are herein sometimes referred to as the B-channel 156 data and D-channel 154 data, respectively. Through the frame formatter 112, transmit signals and receive signals may be simultaneous, rather than multiplexed, if so desired.

The frame formatter 112, through the four interfaces 114, 128, 140, 146, may thereby integrate with the baseband chip 22 and the radio 24 to accomplish desired receptions and transmissions, both of the form of the frame format 150, by the telecommunications unit 20. In particular, the audio interface 128 provides an avenue for the B-channel 156 data received over RF by the unit 20 to pass from the frame formatter 112 to the codec 124 for modulation and also an avenue for the B-channel 156 data encoded at the codec 124 to pass to the frame formatter 112 for formatting and delivery to the radio 24 for RF transmission by the unit 20. As for the microcontroller interface 140 and interrupt interface 146, each provide for complementary activities directed to overall baseband chip 22 control. For example, the D-channel 154 data may be passed over the microcontroller interface 140 from the microcontroller 130 as instructions to the frame formatter 112 for baseband chip 22 transmit and receive operations. The interrupt interface 146, in similar fashion, may serve for passage of interrupt signals from the frame formatter 112 to the interrupt controller 144 upon the existence of conditions at or detected by the frame formatter 112 which dictate changes at the microcontroller 130, such as, for example, software or hardware errors and others. As is apparent from FIG. 3, the interrupt controller 144 and microcontroller 130 are operatively intertwined to provide desired operations of the baseband chip 22. Those skilled in the art will know and appreciate the various possibilities for operations under this and other configurations of those components by virtue of the interfaces 114, 128, 140, 146.

The Microcontroller

Referring back to FIG. 3, the primary component of the system control functions block 40 is the microcontroller 130, which interfaces externally as previously described. The microcontroller 130 also interfaces internally with the interrupt controller 144 via two interrupt signal paths, /INT0 signal 280 and /INT1 signal 282. Another internal interface of the microcontroller 130 is with the CPUCLK signal 256 from the clock generator 248. The CPUCLK signal 256 provides timing clock signals for operation of the microcontroller 130 and, thus, the baseband chip 22. The microcontroller 130 interfaces outside the system control functions block 40 but internally within the baseband chip 22 to the protocol functions block 44 at the frame formatter 112 of that block 44.

Although various types of microcontrollers could be employed in the embodiments of the invention, one suitable microcontroller 130 is some member of the 8051 family of microcontrollers. Those skilled in the art will know and understand the standard 8051 family architecture and instruction set and will know that there are many other possible variations, all suitable for the embodiments. A particular microcontroller, the Advance Micro Devices 80C32T2 (herein 8032), may be particularly suited to application as the microcontroller 130 of the embodiments. Certain enhancements may be made to that particular 8032 model to meet the special needs of the cordless telephone environment, however, those enhancements are within the knowledge and capabilities of those skilled in the art.

Software and Transmit and Receive Operations

Software is imant to control of the baseband chip 22 through the microcontroller 130 operation. Software may be provided to the chip 22 through internal and/or external memories. All operations of the chip 22, as dictated by the microcontroller 130, depend on the particular software driving the operations.

The following describes a transmit operation and a receive operation with a device, according to the embodiments of the present invention. The telephone includes a base unit 20 and a hand unit 20', designated 20 and 20' only for purposes of example. The software of the hand unit 20' is responsible for initiating a transmit communication if the user decides to initiate such communication. In a receive communication scenario, the hand unit 20' detects a communication generated by the base unit 20 when the base unit 20 receives a communication from another device over a connected network 10 (shown in FIG. 1).

To initiate a transmit communication, then, the hand unit 20 may begin from an idle, low power use mode. In that mode, the microcontroller 130 issues a control signal to the clock generator 248 to place and maintain the unit 20 in a low power state. The unit 20 must, therefore, be awakened.

Awakening the unit 20 may be accomplished, for example, by a user who picks up the hand unit 20' and presses a button, such as an on/off button on the hand unit 20'. Of course, other means of awakening the baseband chip 22 are possible, such as, for example, mere removal of the hand unit 20 from its cradle or others according to design. In any event, in embodiments of the invention, the wake-up signal is detected through the parallel ports 228, in particular, Port 4 230 and Port 5 232. This detection causes an interrupt to propagate through the interrupt controller 144, and the interrupt controller 144 causes the chip 22 to wake up to an active state. At that point, the microcontroller 130 may begin to evaluate the source of the interrupt.

In evaluating the source of the interrupt, the microcontroller 130 may inquire of the interrupt controller 144 what caused the interrupt. The interrupt controller 144 may then respond with an answer, such as, for example, that the interrupt resulted from the key scanner which is detected, as previously mentioned, through the parallel ports 228, particularly Port 4 230 and Port 5 232. Then, the microcontroller 130 may go about determining which key of the keypad detected by the keypad scanner (not shown) was pressed, and, if the key was pressed, that the on/off key was the particular key. If there is no on/off key in the device, the microcontroller 130 would, nonetheless, detect in similar fashion that the unit 20' was activated to awaken.

Although other embodiments are possible, it is a possibility that such a wakening of the chip 22 itself causes the hand unit 20' to link over RF (i.e., an RF link 16 shown in FIGS. 1–2) to the base unit 20. In that case, the microcontroller 130 may send commands to the frame formatter 112 over the interface 146, signaling the frame formatter 112 to initiate a call. The microcontroller 130 may also through that interface 140 send certain data and that data will be transmitted by the frame formatter 112 on the $T_{XBB}$ pin 226.

Additionally, the microcontroller 130 may send commands to, for example, Port 6 234 thereby turning on the radio 24 so that transmissions by the radio 24 are possible. Thereafter, the microcontroller 130 may wait for an acknowledgment from the base unit 20, which acknowledgment would be received by the baseband chip 22 of the hand unit 20' through the $R_{XBB}$ pin 228.

When the hand unit 20' receives the acknowledgment message back from the base unit 20, an interrupt may be triggered and propagated through the interrupt controller 144 to the microcontroller 130. That interrupt signals the microcontroller 130 that an active RF link 16 has been established between units 20, 20'. Thereafter, the microcontroller 130 may begin taking key entries for a number that is to be transmitted and which corresponds to another device, for example, the corded telephone 13 (shown in FIG. 1), to connect over the network 10.

The microcontroller 130 may collect the key entries in several ways. For example, the microcontroller 130 may collect numbers from the key scanner in the parallel ports 228 and then transmit the collected numbers as data over the $R_{XBB}$ pin according to the particular frame format 150 of the units 20, 20'. The format 150 then transmitted by the hand unit 20' may notify the base unit 20 of the key that has been depressed. At the base unit 20, the transmission will be received and read. The base unit 20 then determines that the particular keypad number corresponding to the depressed key dictates a particular DTMF tone. The base unit 20 will then transmit those tones.

Another possibility for informing the base unit 20 of the depressed key at the hand unit 20' is for the microcontroller 130 to directly signal the codec 124. The codec 124 may then generate the DTMF tones that correspond to the key that was pressed and send those over the voice channel. The base unit 20, in that scenario, is not involved in the transmission.

After the depressed keys are transmitted by the hand unit 20' to the base unit 20 over the RF link 16 set up between the units 20, 20', the PSTN or other network 10 carries the transmitted information indicative of the keys depressed in order to make a connection with a another telecommunications device, such as the corded telephone 13 (FIG. 1). The PSTN will send a ring that is conducted back to the base unit 20, hand unit 20', and through the earpiece (not shown) so the user will detect that the transmitted communication is in process and so that the voice B-channel 156 will be open. When the connection is made to the other device, a voice connection is established from the hand unit 20' through the base unit 20 to the other device over the network 10.

Now discussing receive operations by a telecommunications device comprised of the base unit 20 and hand unit 20', a link set-up over the PSTN is initially made to the base unit 20. In that instance, the hand unit 20' may again be in an idle, low power consumption state. The hand set 20', however, wakes-up periodically, according to design of the wake-up timer 238 previously described. The periodic wake-up enables the hand unit 20' to check for any message from the base unit 20 if a call received by the base unit 20 is pending. So, in effect, the hand unit 20' awakens periodically at the end of some time period, for example, one second. Because the hand unit 20' will likely be programmed to wake up at shorter time intervals than the base unit 20 in order to save power, the base unit 20 may transmit continuously to the hand unit 20' for a longer time interval. When the hand unit 20' wakes up as it normally would do periodically, the hand unit 20' turns on its radio 24 (shown in FIG. 2) and will detect any message coming in from the base unit 20 over the RF. The base unit 20 will be detected by the radio 24 of the hand unit 20' and the detected signal delivered to the baseband chip 22 of the hand unit 20' over the $R_{XBB}$ pin 228.

The received message will be interpreted by the microcontroller 130 to mean establish a link setup with the base unit 20, and the microcontroller 130 will go through the sequence of steps, in the manner previously described with respect to transmissions, to control the baseband chip 22 to set up the link. Those steps of the microcontroller 130 and activities of the baseband chip 22 in response to them operate to set up a voice connection between the receive baseband signals reaching the ($R_{XBB}$) pin 228 and the transmit baseband signals transmitted from the $T_{(XBB)}$ pin 226 and the audio transducers, connected at pins AIN 200 and pins AOP and AON 202, of the respective units 20, 20'.

In the course of link setups, certain data may be transmitted and received back and forth between the base unit 20 and the hand unit 20'. That identification data may serve to secure the RF communications between the base unit 20 and the hand unit 20', preventing the units 20, 20' from locking onto transmission signals of others also in communicating in the RF. The identification data may be stored in an electronically erasable prompt, for example, that is interfaced with the synchronous serial port 284 through pins SDIN 288, SDOUT 290, SCLK 286.

Figures 1, 5:
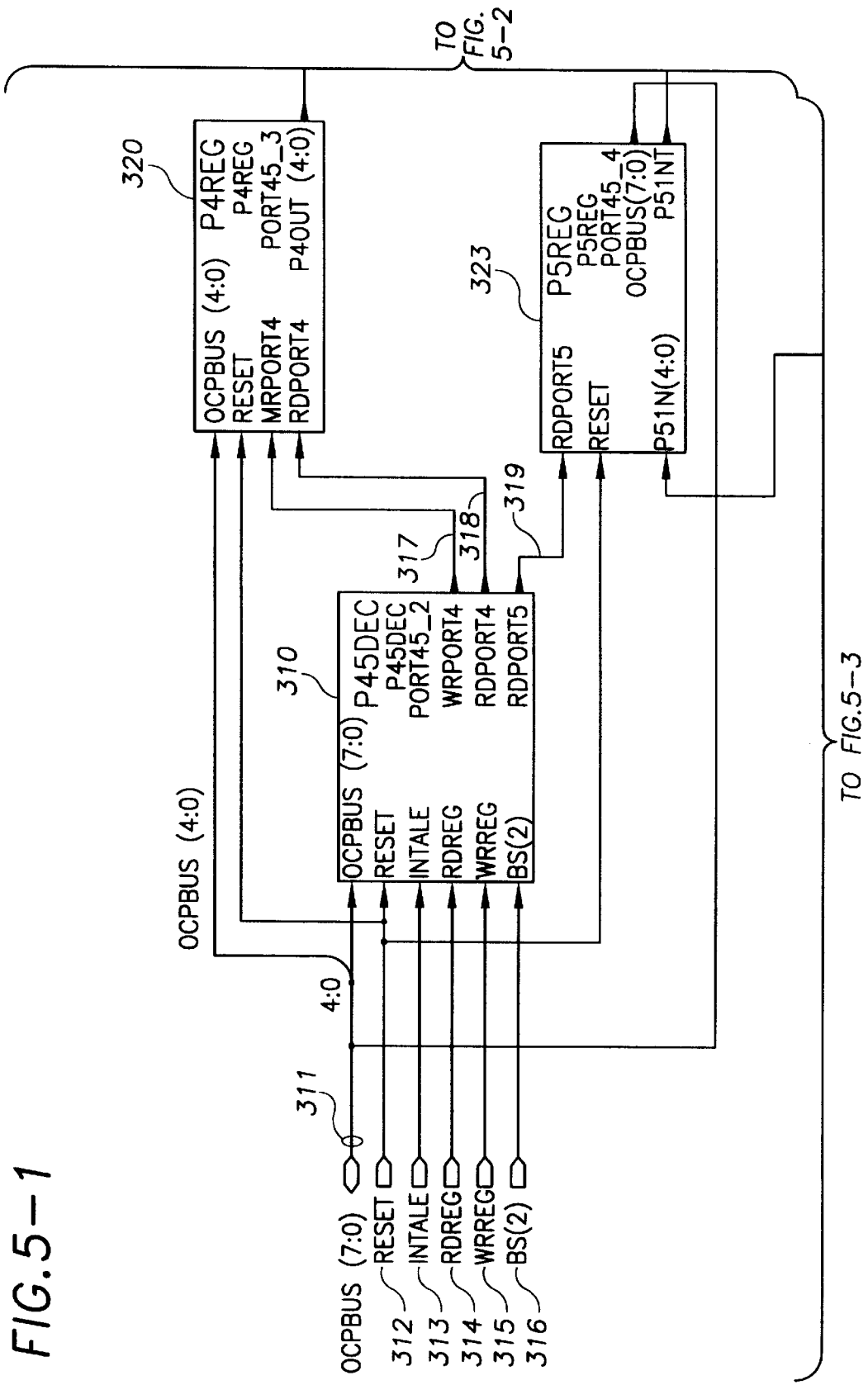
FIG. 5 is a schematic block diagram of ports 230 and 232 of FIG. 3.
Figures 4, 5:
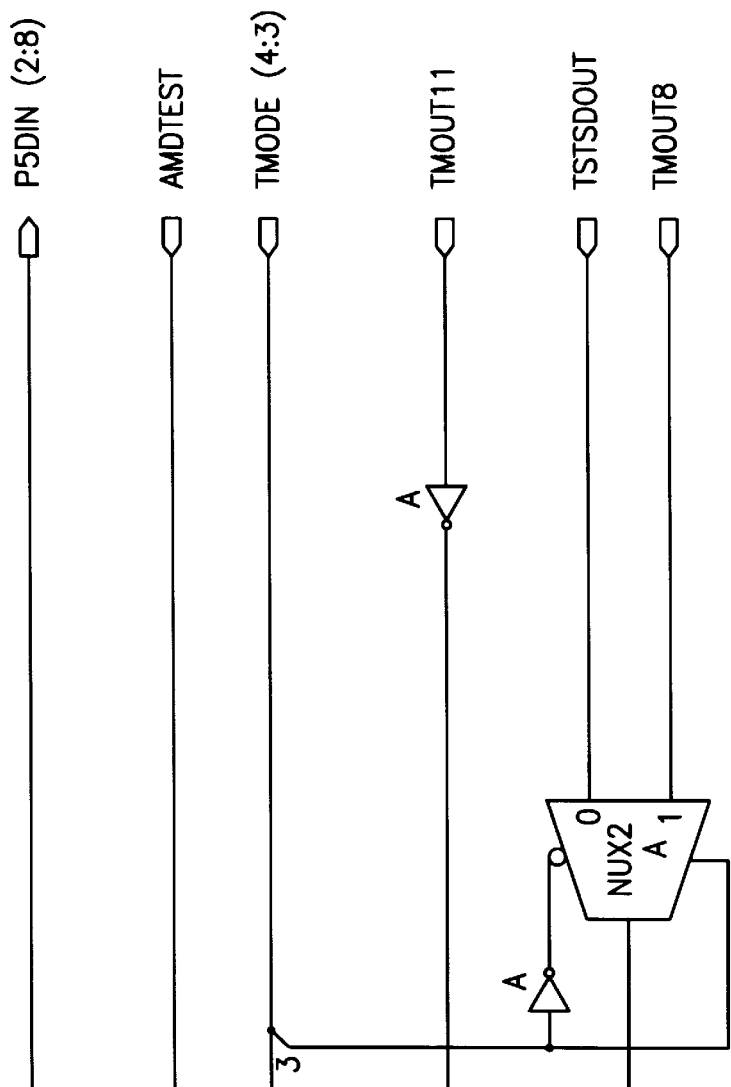

Referring to FIG. 5 of the drawings, a P45DEC 310 is a decode for the registers. One input is a bus called OCPBUS 311 that is internal to the chip. On the OCPBUS 311 the data and address for the registers are transferred. Another input to the P45DEC is a chip reset line 312, which is the internal reset for the chip. Other inputs to the P45DEC are an internal ALE (INTALE) 313, a read register strobe (RDREG) 314, a write register strobe (WRREG) 315, and a block select BS(2) 316. The block select 316, which is generated in another block, is a decode of the four upper bits of OCPBUS 311. The outputs of the P45DEC 310 are a write port4 (WRPORT4) 317, a read port4 (RDPORT4) 318, and a read port5 (RDPORT5) 319, which are basically decodes from instructions that come from the microcontroller, whether you are reading or writing register port4 or reading port5 232.

A P4REG 320 register is the port4 register, which is a five bit register that programs the desired value to drive the Port 4 230 pins. The inputs of the P4REG 320 include the OCPBUS 311, bits four through zero, which are the data bits that are being written to the P4REG 320 register. The inputs also include the chip reset line 312, the write port4 317 line, and the read port4 318 line.

The output line of the P4REG 320 register is P4OUT 321, which goes to the drivers for the pins. If the signal on P4OUT 321 is high, it will drive the Port 4 230 pins high. If it is low, it will drive the Port 4 230 pins low. The line P4OUT 321 is an input into five pad drivers, represented by the block IOBUFF 322. A P5REG 323 register is the port5 register, which is a read only register. The inputs include the RDPORT5 line 319, the reset line 312, and a P5IN line 324. The signal on the P5IN line 324 is five bits, and is the representative value of what is at the five Port 5 232 pins.

The P5IN line 324 is the output line from an IOBUFF block 325, which represents two buffers, for two of the Port 5 232 pins. The IOBUFF buffers 326, 327, and 328 exist for the remaining three Port 5 232 pins. The IOBUFF buffers 325, 326, 327, and 328 contain the input logic for the pad, that is, the pad drivers for the P5 pin. The output of the blocks 325, 326, 327, and 328 are the P5IN lines 324, which give the value of the Port 5 232 pins when the port5 register 323 is read.

The output of the P5 register 323 is the OCPBUS 311. When the register is read, the data will go on the OCPBUS 311. Another output of the P5 register 323 is P5INT, which on any change of the value of the pins of Port 5 232, whether it is going from low to high or high to low, the P5INT signal will go active, or high, whenever it detects a change in those P5 values.

Figures 1, 6:
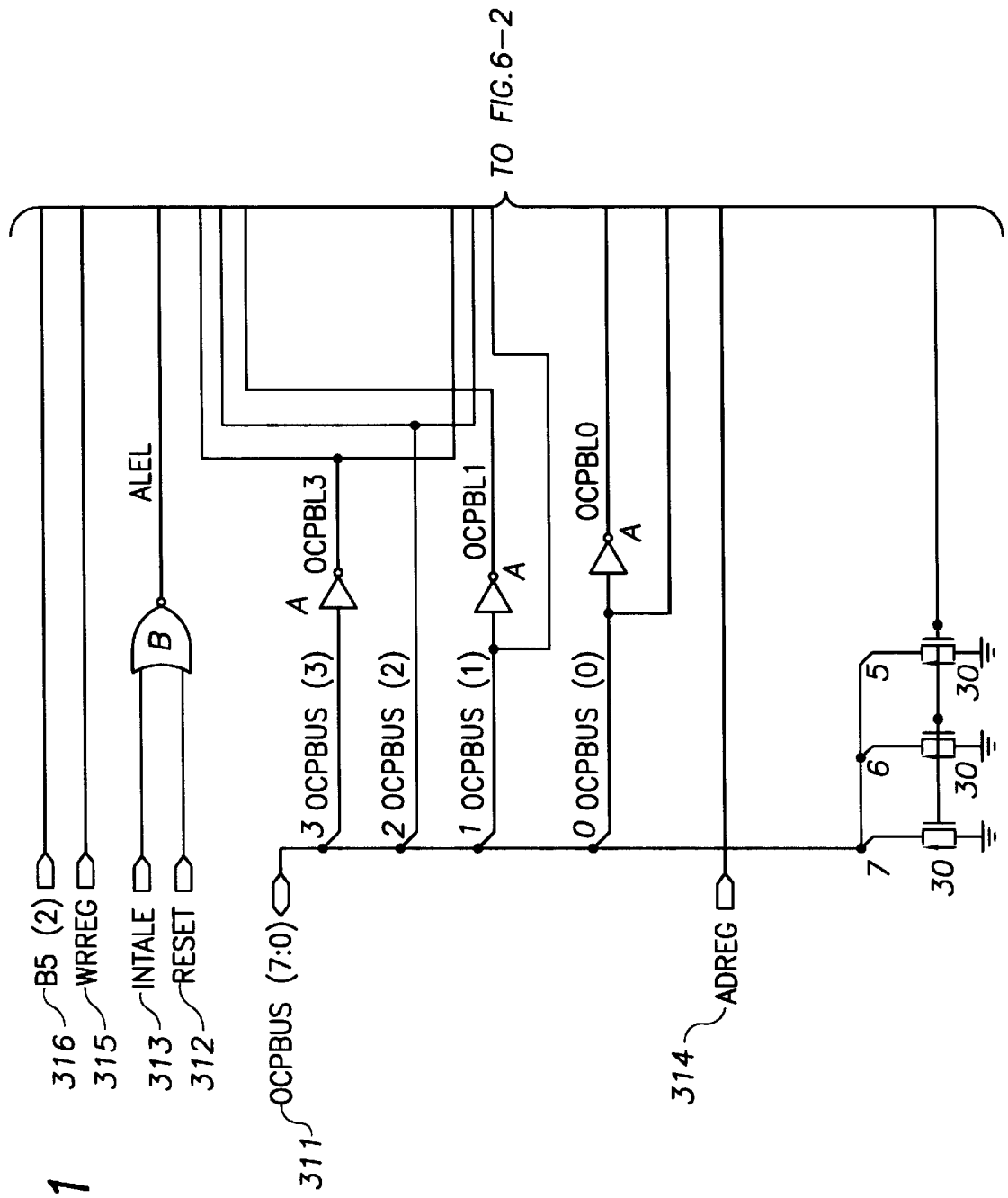
FIG. 6 is a schematic block diagram of the register address decodes for ports 230 and 232 of FIG. 3.

Referring to FIG. 6 of the drawings, the P45DEC 310 decode comprises two blocks 340 and 342, which are a decode logic. The blocks 340 and 342 take the ALE strobe, whether the system is reading or writing the register, and decode the bottom four bits of the OCPBUS 311, thus generating the signals on the lines write port4 317, read port4 318, and read port5 319, so that the system can read or write to port4 and port5.

Figure 7:
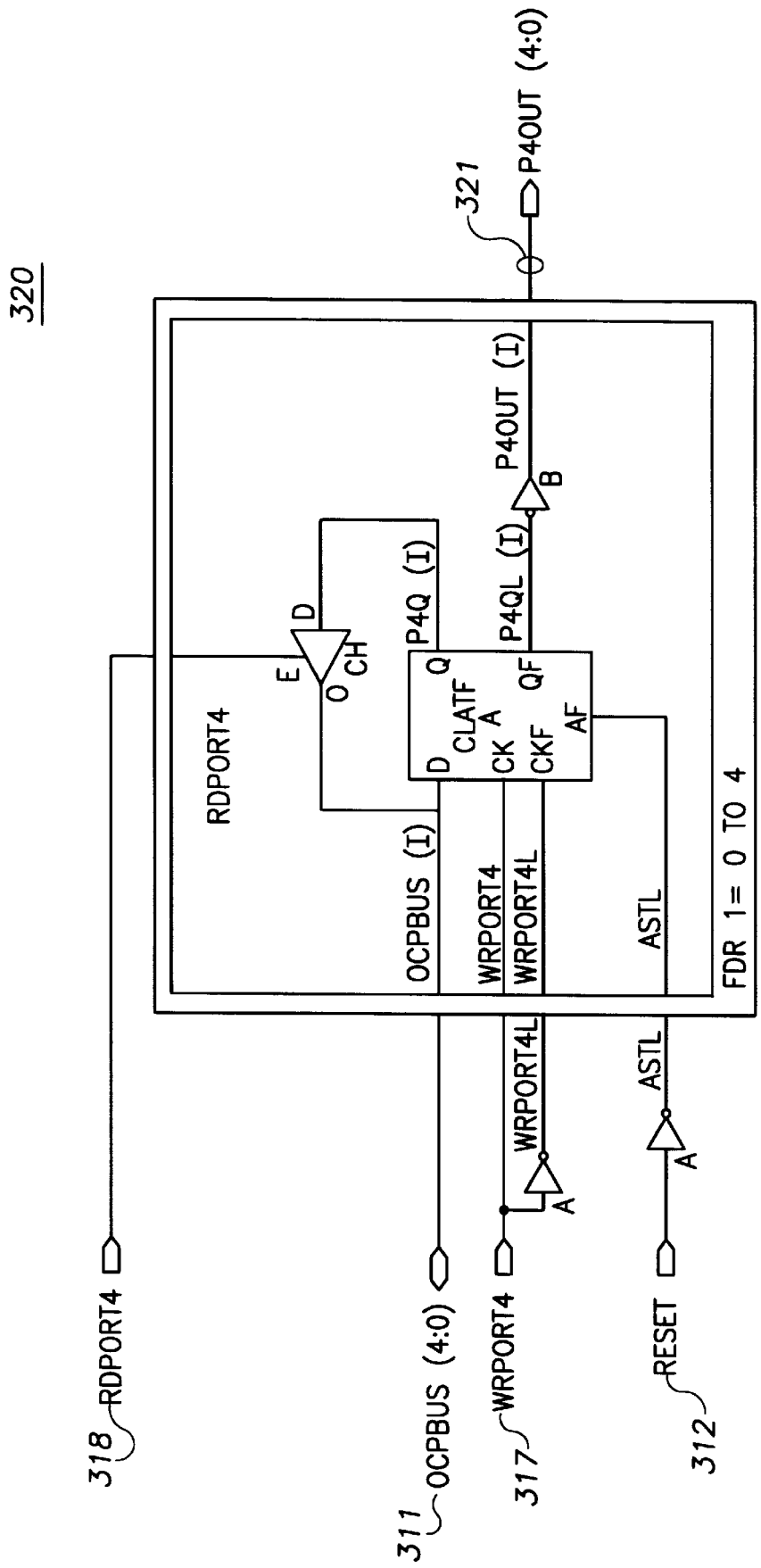
FIG. 7 is a schematic block diagram of the register for port 230 of FIG. 3.

Referring to FIG. 7 of the drawings, the P4REG 320 register is shown. The drawing actually represents five latches, which allow port4 to handle five bits. The system programs each of those five bits to be either high or low, and such value is driven out to the P4 pin on the line 321.

Figures 2, 8:
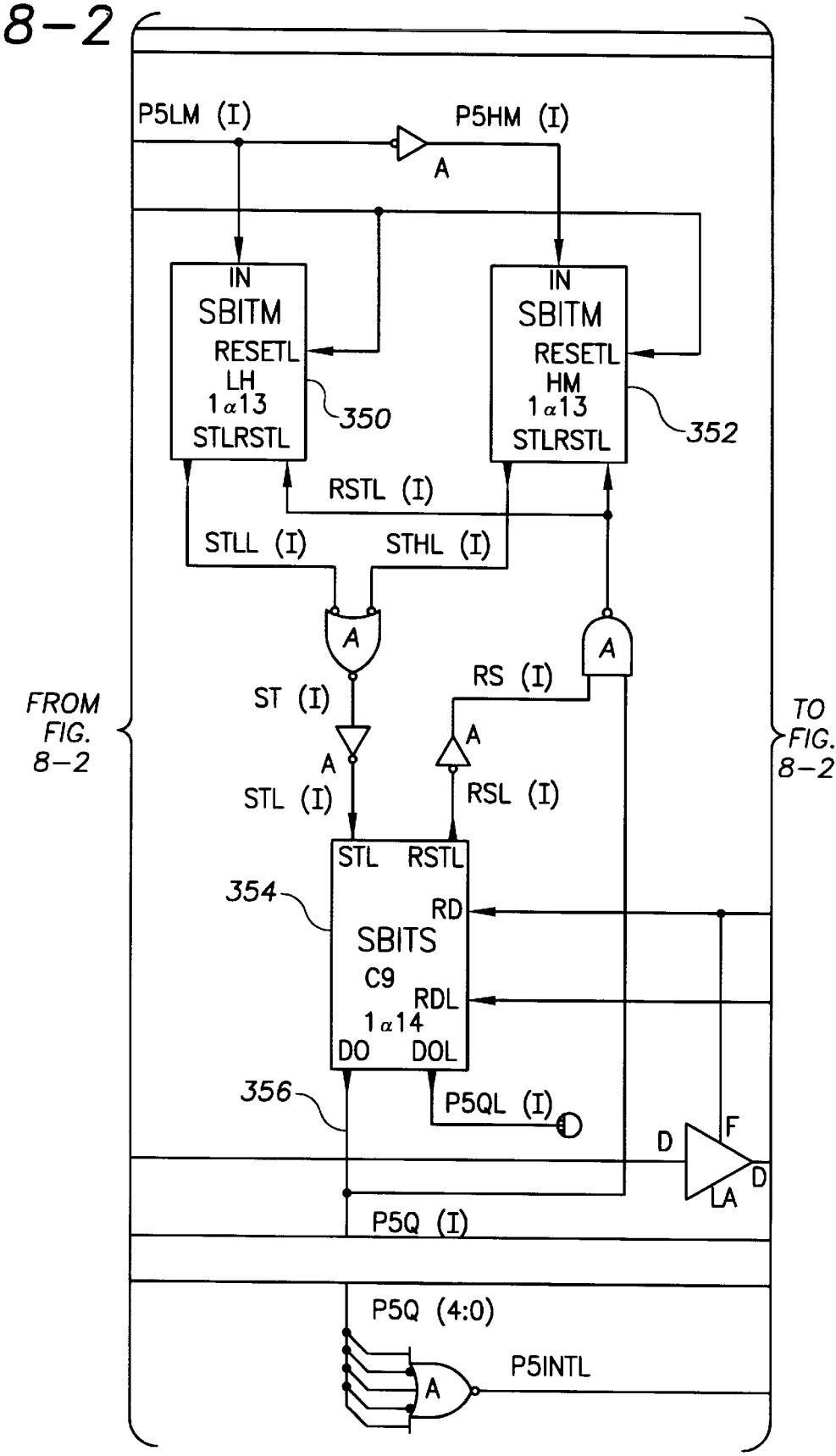
FIG. 8 is a schematic block diagram of the register for port 232 of FIG. 3.
Figures 3, 8:
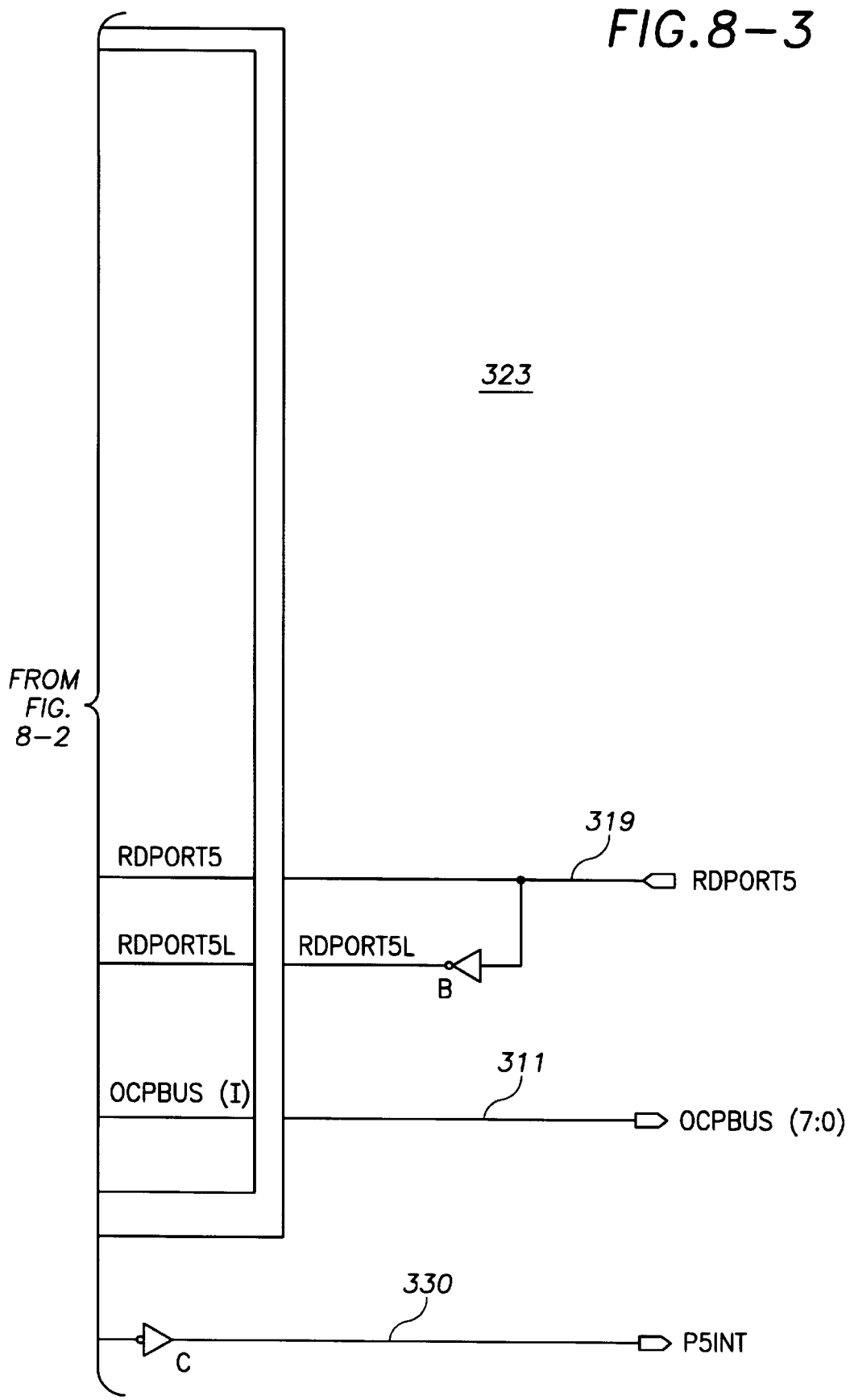

Referring to FIG. 8 of the drawings, the port5 register 323 includes transition detect logic. One input to the register 323 is the P5IN signal on line 324, which is the value at the P5 pin. The port5 register 323 includes two transition detectors SBITM 350, 352 ("masters"), which detect either a low-to-high or a high-to-low transition. The SBITM transition detectors 350, 352 feed into a SBITS detector 354 ("slave"). If either of the transition detectors 350, 352 go active, such action will set the SBITS detector 354, which then will generate a signal on the P5INT line 330. When the read port5 line goes active, the system is reading the value at the pins. When the read port5 line goes active, it also keeps the value of the signal from changing at the DO pin 356. As a result of the port5 read the SBITM 350, 352 are reset.

Figures 1, 9:
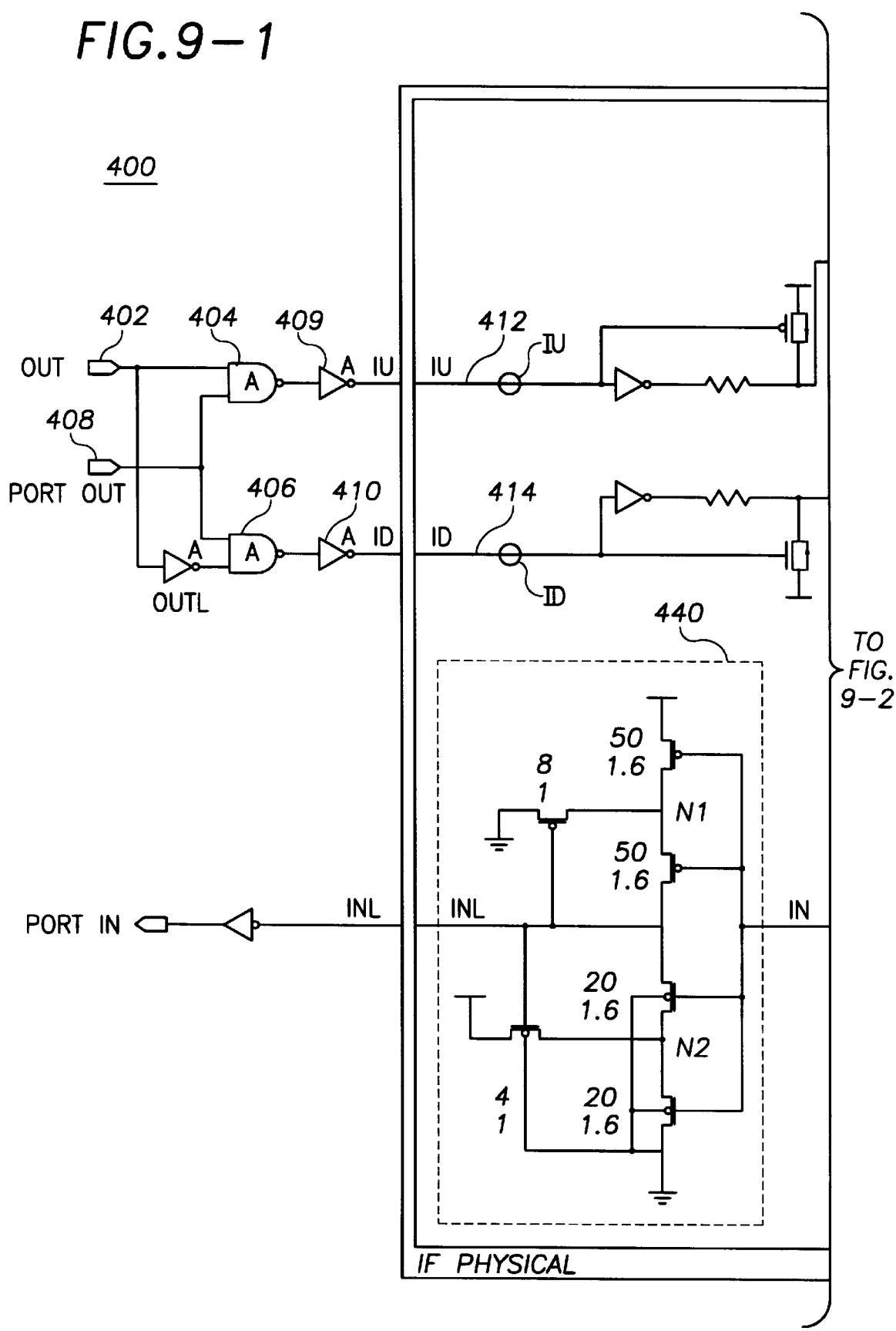
FIG. 9 is a schematic block diagram of the drivers for the input/output pad of port 230 of FIG. 3.
Figures 2, 9:
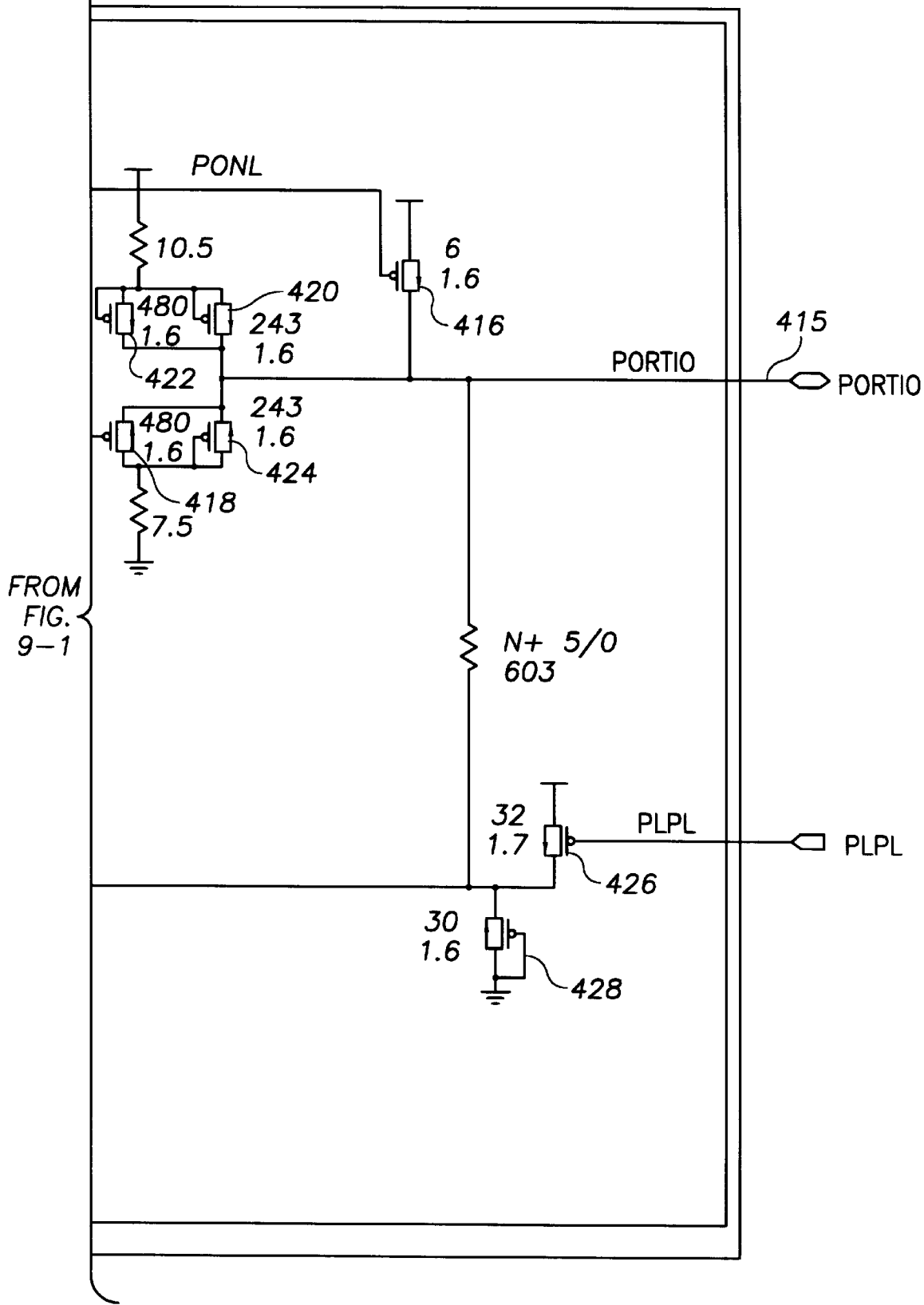

Referring to FIG. 9 of the drawings, an input/output pad 400 is depicted. A signal OUT 402 is an input into two gates 404, 406. If that signal is low then the IOBUFF 322 is configured to be an input; if it is high, it is configured to be an output. The value that the system drives out the pad will be the value of the signal on another input line, PORTOUT 408. The signal from the gate 404 passes through an inverter 409. The signal from the gate 406 passes through an inverter 410. The output of the inverter 409 is an IU signal on a line 412. The output of the inverter 410 is an ID signal on a line 414. The IU and ID signals drive the port 10 signal, on line 415, connected to the pin 230, either high or low. When the IU and ID signals are low, they turn off the weak high driver transistor 416 and turn on the strong low driver transistor 418. The driver transistor 416 is a weak PFET. When the IU and ID signals are high, they turn off the strong low driver transistor 418 and turn on the weak high driver transistor 416. The driver transistor 418 is a strong NFET. When IU is low, and ID is high, neither driver 416 or 418 is on, and the pin is configured as an input or tri-state.

The logic of the gates and inverters 404, 406, 409, and 410 ensures that the system is not trying to drive the pin 230 high and low at the same time. The logic ensures that the system is either driving it high or driving it low, or even tri-state in some cases. If the system is trying to drive the pin high and low at the same time, it burns a lot of current through the driver transistors 416 and 418.

The group of transistors 440 is a Schmitt-trigger inverter.

Transistors 420, 422, 424, 426, and 428 protect against electrostatic discharge.

Figures 1, 10:
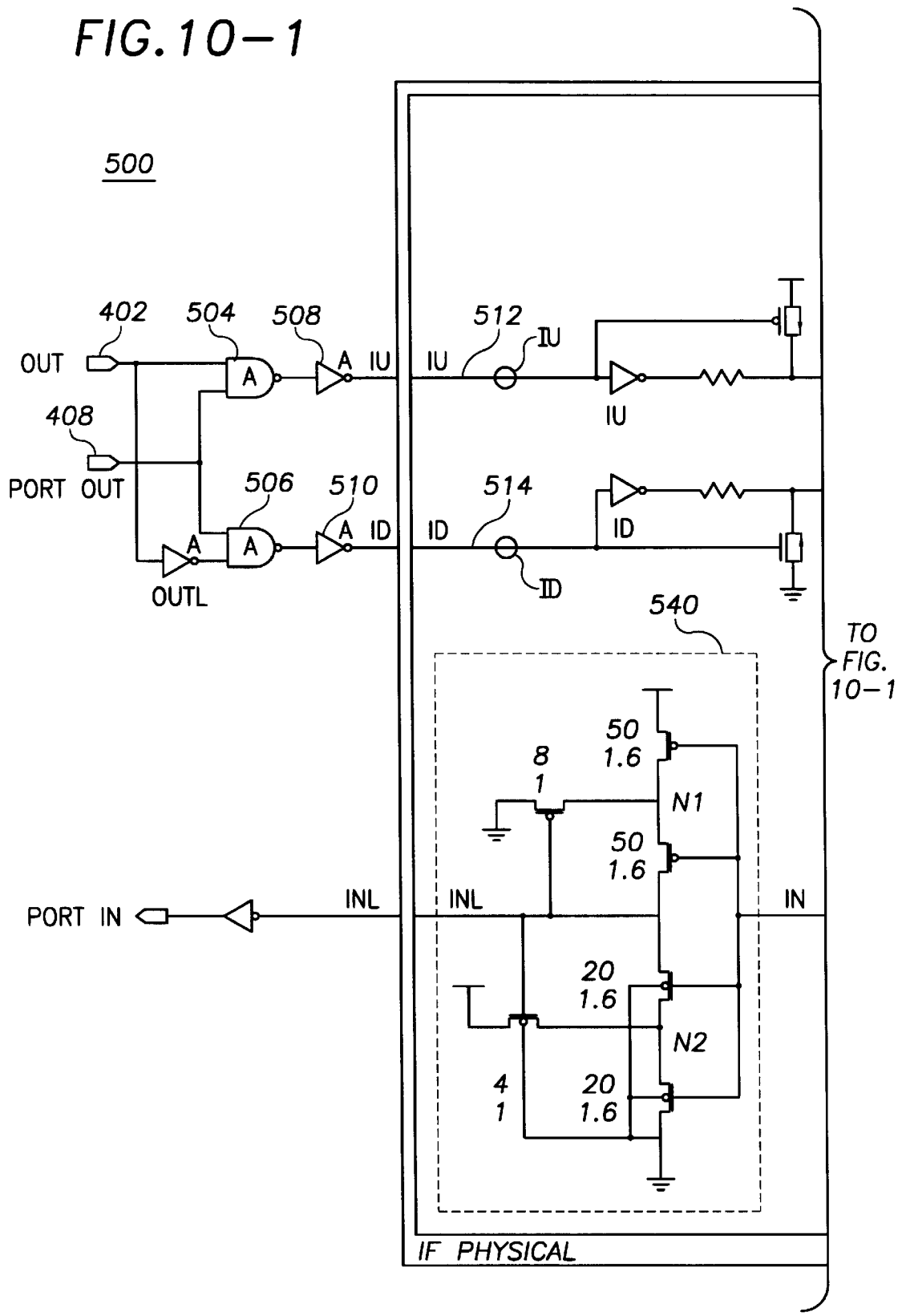
FIG. 10 is a schematic block diagram of a generic input/output port for port 232.
Figures 2, 10:
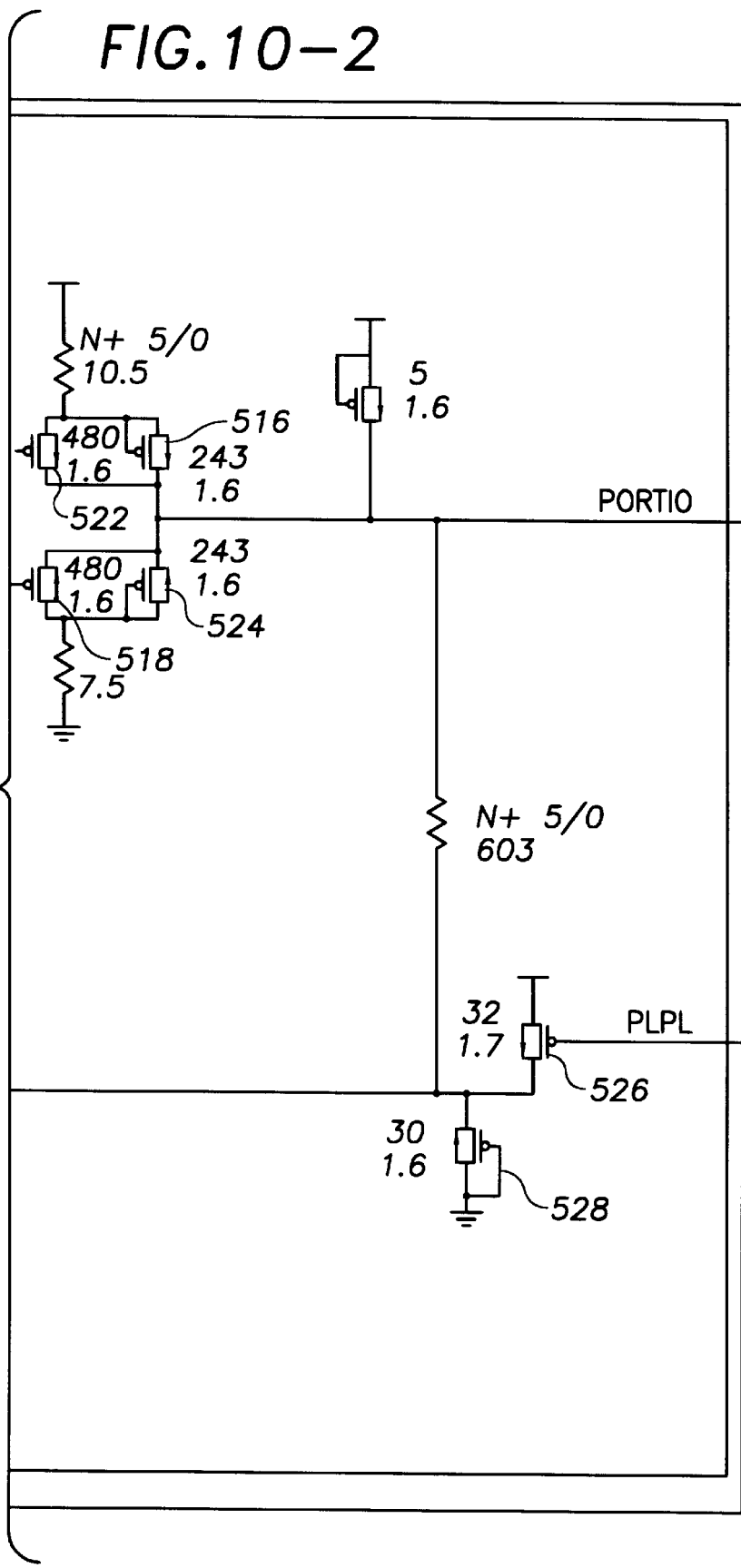

Referring to FIG. 10 of the drawings, a generic input/output port 500 for the port 232 is depicted. In other words, the generic input/output port 500 comprises the blocks labeled IOBUFF 325, 326, 327, and 328 in FIG. 5. A signal OUT 402 is an input into two gates 504 and 506. If that signal is low then IOBUFFs 325, 326, 327, and 328 are configured to be an input; if it is high, they are configured to be an output. The value that the system drives out the pad will be the value of the signal on another input line, PORTOUT 408. The signal from the gate 504 passes through an inverter 508. The signal from the gate 506 passes through an inverter 510. The output of the inverter 508 is an IU signal on a line 512. The output of the inverter 510 is an ID signal on a line 514. The IU and ID signals drive the port IO signal, on line 515, connected to the pin 232, either high or low. When the IU and ID signals are low, they turn off the weak high driver transistor 516 and turn on the strong low driver transistor 518. The driver transistor 516 is a strong PFET. When the IU and ID signals are high, they turn off the strong low driver transistor 518 and turn on the weak high driver transistor 516. The driver transistor 518 is a strong NFET.

The logic of the gates and inverters 504, 506, 508, and 510 ensures that the system is not trying to drive the pin 232 high and low at the same time. The logic ensures that the system is either driving it high or driving it low, or even tri-state in some cases. If the system is trying to drive the pin high and low at the same time, it burns a lot of current through the driver transistors 516 and 518.

The group of transistors 540 is a Schmitt-trigger inverter.

Transistors 516, 524, 526, and 528 protect against electrostatic discharge.

Figure 11:
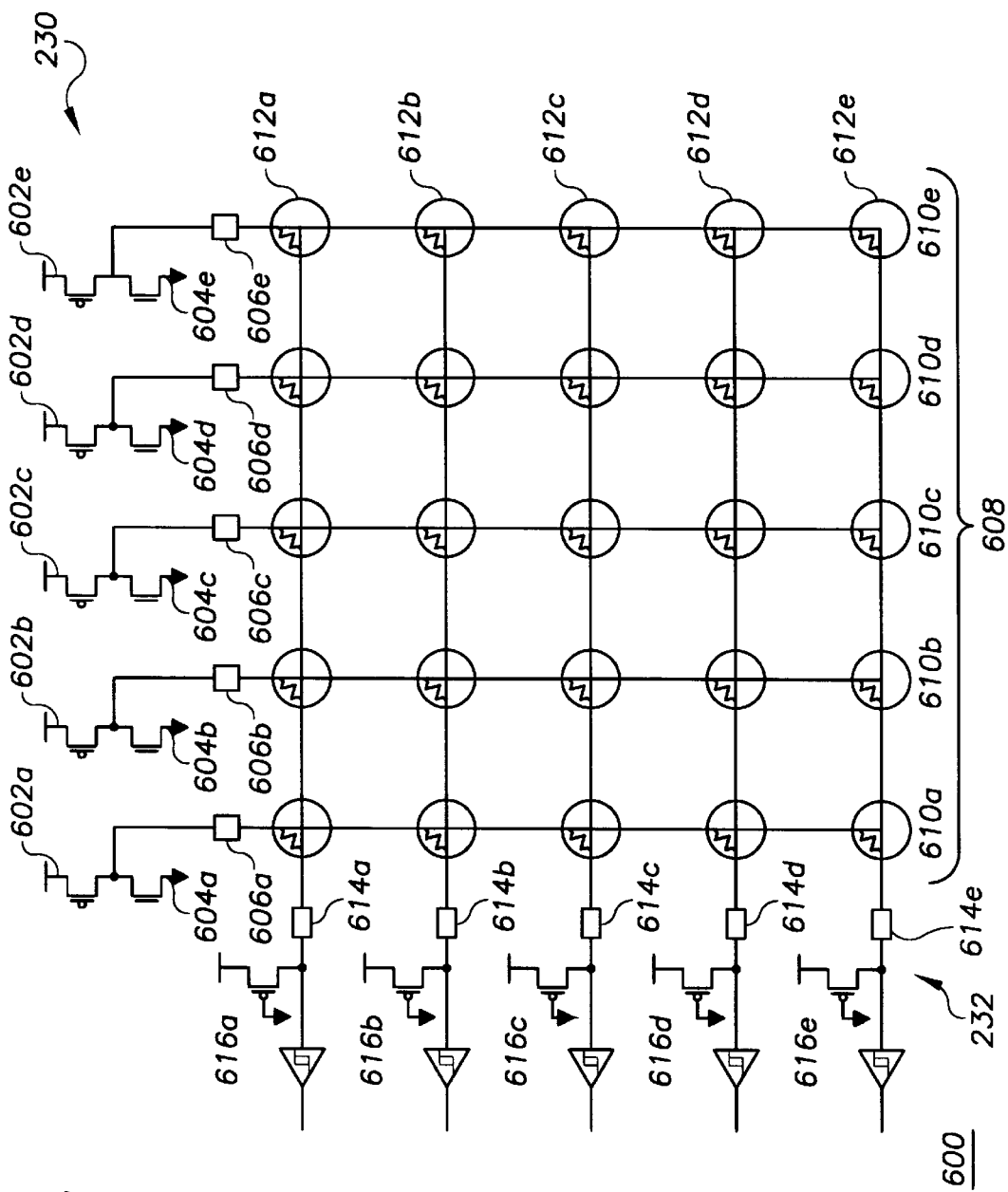
FIG. 11 is a schematic block diagram of an array of keypad switches.

Referring to FIG. 11 of the drawings, an array of switches 600 for a keypad on a cordless phone is depicted. Each pin of the port4 230 is connected to two transistors, or drivers, each. Drivers 602a–e are weak, or small, P channel transistors for driving the pins high. Drivers 604a–e are strong, or large, N channel transistors for pulling the pins low. The drivers are internal to the chip 22. The drivers 602 and 604 are connected to the pins 606a–e of the port4 230 of the chip 22. The pins 606 connect to an external keypad 608 on the units 11 and 12. The keypad 608 contains columns of keys 610a–e which connect to the pins 606a–e.

The keypad 608 contains rows of keys 612a–e which connect to pins 614a–e of the port5 232. The pins 614a–e connect to P channel weak pull-up drivers 616a–e. The gates of the drivers 616a–e are tied to ground, which means that the outputs of the drivers 616 are always one. The outputs of the drivers 616 go to the Schmitt-trigger inverter input buffer 540 shown in FIG. 10, in conjunction with the value at the P5 pin 614a–e, which then drives the logic internal to the chip 22.

In operation, each key, when pressed, creates a connection between a pin of port4 230 and a pin of port5 232. It is possible for the user to accidentally cause multiple key closures. If there is a multi-key closure, shorting two of the pins 606 together, the strong low value out will end up winning the "struggle". So that even though the user is driving two different pins, he is driving a pin 606 low and he is also driving another pin 606 to the weak high value, what the system sees when it reads the port5 register 323 is all as low. There will be a valid low value which is below the voltage input low level for the specification for the chip 22. The result is that the system reads a low value which software can interpret as multiple keys pressed.

In contrast, with prior technology, if the system had strong high drivers for the drivers 602, and there were multiple keys closed, the system would have a voltage at the pins 614 which would be somewhere between zero and Vcc. That voltage level may or may not be high enough to trip the input buffer, so that when the system reads the value at the port5 register 323, it will read invalid highs or lows, and thus the data it produces is garbage. However, with the present invention, the weak high drive, it is guaranteed that multiple key closures will drive the input pad low.

It is understood that several variations may be made in the foregoing without departing from the scope of the invention. For example, the system may accomplish the same result, a determinate voltage resulting from two keys being pressed at the same time, by using weak low drivers for the drivers 604, and strong high drivers for the drivers 602 for the Port 4 230, and weak pull downs for the drivers 616 for Port 5 232.

Although illustrative embodiments of the invention have been shown and described, a wide range of modification, change, and substitution is contemplated in the foregoing disclosure, and in some instances, some features of the present invention may be employed without a corresponding use of the other features. Accordingly, it is appropriate that the appended claims be construed broadly and in a manner consistent with the scope of the invention.

What is claimed is:

1. In a device comprising an array of switches arranged to couple a first set of terminals on a first axis of the array to a second set of terminals on a second axis of the array, the switches arranged for sending signals to a decoding logic, and further arranged so that a short can occur between any two terminals of the first set, a system for converting an indeterminate signal resulting from a short to a determinate signal, comprising:

weak logic high drivers coupled to the terminals of the first set;

strong logic low drivers arranged to pull logic low and coupled to the weak logic high drivers and to the terminals of the first set;

weak high pull-up drivers coupled to the terminals of the second set; and input buffers comprising Schmitt trigger inverters and coupled to the weak high pull-up drivers and to the terminals of the second set.

2. The system of claim 1, wherein the switches are relays.

3. In a device comprising an array of switches arranged to couple a first set of terminals on a first axis of the array to a second set of terminals on a second axis of the array, the switches arranged for sending signals to a decoding logic, and further arranged so that a short can occur between any two terminals of the first set, a system for converting an indeterminate signal resulting from a short to a determinate signal, comprising:

weak logic low drivers coupled to the terminals of the first set;

strong logic high drivers arranged to pull logic low and coupled to the weak logic low drivers and to the terminals of the first set;

weak high pull-down drivers coupled to the terminals of the second set; and input buffers comprising Schmitt trigger inverters and coupled to the weak high pull-down drivers and to the terminals of the second set.

4. The system of claim 3, wherein the switches are relays.

5. A digital cordless telecommunications unit, the unit including a baseband chip, the unit adapted for receiving and transmitting analog voice signals, for transmitting digital baseband signals, and for receiving digital formatted baseband signals, comprising:

an audio functions block, comprising:
 a. an audio front end for receiving said analog receive voice signals and transmitting said analog transmit voice signals;
 b. an adaptive differential pulse code modulator codec connected to said audio front end, said codec converting said analog receive voice signals to said digital baseband transmit signals and converting said digital formatted baseband receive signals to said analog transmit voice signals; and a system control functions block, comprising:
 a. a microcontroller for controlling the baseband chip;
 b. a memory accessible by the microcontroller for storing control instructions;
 c. an interrupt controller connected to the microcontroller;
 d. a wake-up timer connected to the interrupt controller;
 e. a clock generator connected to the microcontroller;
 f. a synchronous serial port connected to the interrupt controller; and
 g. parallel ports connected to the interrupt controller, the parallel ports comprising an array of switches arranged to couple a first set of terminals on a first axis of the array to a second set of terminals on a second axis of the array, and further comprising:
  (1) weak logic high drivers coupled to the terminals of the first set;
  (2) strong logic low drivers arranged to pull logic low and coupled to the weak logic high drivers and to the terminals of the first set;

(3) weak high pull-up drivers coupled to the terminals of the second set; and
(4) in parallel with the weak high pull-up drivers, input buffers comprising Schmitt trigger inverters and coupled to the weak high pull-up drivers and to the terminals of the second set.

* * * * *